(12) United States Patent
Ooishi et al.

(10) Patent No.: US 6,714,451 B2
(45) Date of Patent: Mar. 30, 2004

(54) SEMICONDUCTOR MEMORY DEVICE INCLUDING BIT SELECT CIRCUIT

(75) Inventors: Tsukasa Ooishi, Hyogo (JP); Hiroshi Kato, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/146,021

(22) Filed: May 16, 2002

(65) Prior Publication Data

US 2003/0099132 A1 May 29, 2003

(30) Foreign Application Priority Data

Nov. 26, 2001 (JP) ........................................ 2001-359181

(51) Int. Cl.$^7$ .............................................. G11C 16/16
(52) U.S. Cl. ............................ 365/185.09; 365/185.17; 365/185.25
(58) Field of Search ....................... 365/185.09, 185.17, 365/185.25, 185.23

(56) References Cited

U.S. PATENT DOCUMENTS 6,011,725 A    1/2000   Eitan 6,134,142 A  * 10/2000   Hirano ................... 365/185.09
6,301,158 B1 * 10/2001   Iwahashi ............... 365/185.23

FOREIGN PATENT DOCUMENTS

JP           9-191094           7/1997

OTHER PUBLICATIONS

"Can NROM, a 2–bit, Trapping Storage NVM Cell, Give a Real Challenge to Floating Gate Cells", Boaz Eitan et al., Presented at the International Conference on Solid State devices and Materials, Tokyo, Japan, 1999, pp. 1–3.

* cited by examiner

Primary Examiner—Huan Hoang
(74) Attorney, Agent, or Firm—McDermott, Will & Emery

(57) ABSTRACT

A plurality of nonvolatile memory cells having gates connected to a same word line, respectively, are connected in series, and connected to adjacent bit lines, respectively. When data is sequentially written to the plurality of nonvolatile memory cells, a bit line select circuit sequentially supplies a write potential outputted from a predetermined potential generation circuit to a plurality of bit lines. The bit line to which the write potential has been supplied once is kept to have the potential. Due to this, this nonvolatile semiconductor memory device can reduce an area occupied by a memory cell array.

16 Claims, 15 Drawing Sheets

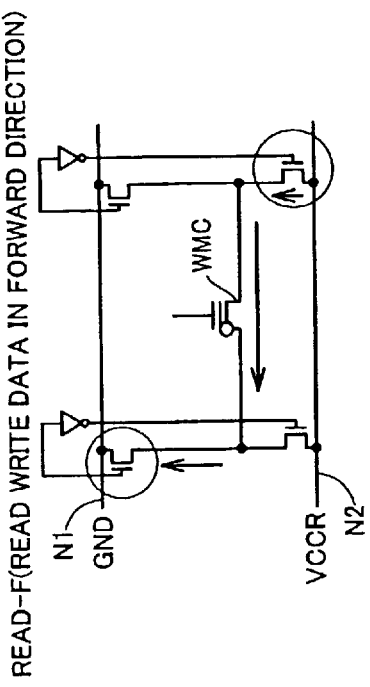
FIG.12A
WRITE-F:WRITE IN FORWARD DIRECTION
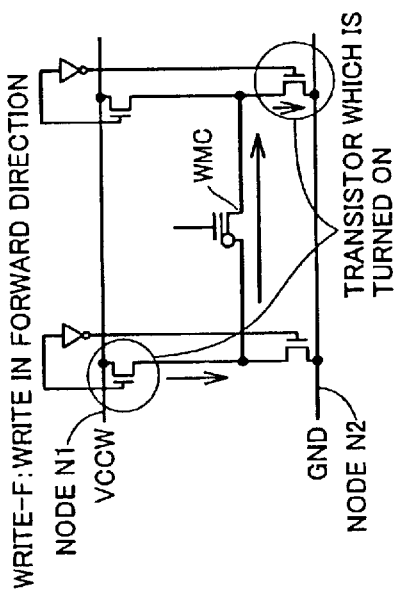
FIG.12B
READ-F(READ WRITE DATA IN FORWARD DIRECTION)
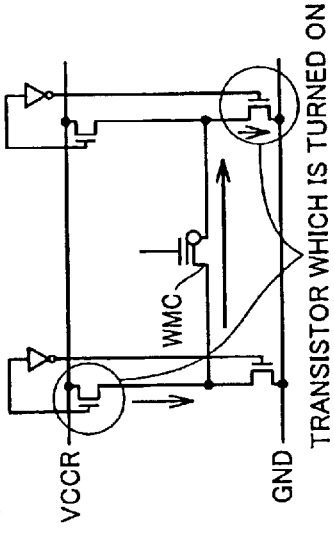
FIG.12C
WRITE-R:WRITE IN REVERSE DIRECTION
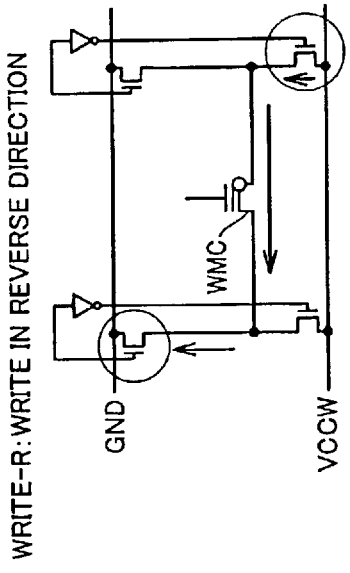
FIG.12D  IT IS IMPORTANT THAT STATES OF DECODERS ARE ALL THE SAME WHEN SAME CELL IS ACCESSED
READ-R(READ OF WRITE DATA IN REVERSE DIRECTION)

SEMICONDUCTOR MEMORY DEVICE INCLUDING BIT SELECT CIRCUIT

BACKGROUND OF THE INVENTION

1. Field of the Invention

The present invention relates to a nonvolatile semiconductor memory device and particularly relates to a flash memory capable of reducing a memory cell area.

2. Description of the Related Art

A nonvolatile semiconductor memory device represented by a flash EEPROM (Electrically Batch Erasable, Programmable ROM to be referred to as "flash memory" hereinafter) is capable of storing data in a nonvolatile manner and no power supply is required to hold the data.

FIG. 17 is a partly enlarged plan view of the memory cell array of a conventional flash memory.

Referring to FIG. 17, a plurality of source lines 1 and a plurality of drain lines 2 are alternately arranged. A plurality of control gate lines 4 are arranged to be orthogonal to plural source lines 1 and drain lines 2. Each of a plurality of floating gates 3 is arranged between source line 1 and drain line 2 right under control gate line 4. A memory cell MC is arranged to correspond to the intersections between control gate lines 4 and source lines 1 and drain lines 2.

Accordingly, if a minimum processed dimension is assumed as F, the memory cell area of memory cell MC is $4F \times 2F = 8F^2$.

The main targets of memories are moved from personal computers to digital home appliances or communication equipment. Since the function of a mobile terminal such as a cellular phone or a PDA (Personal Digital Assist) improved, the mobile terminal requires a memory having a mass storage and a small area.

As such a memory having a mass storage and a small area, a flash memory which is a nonvolatile semiconductor memory device has been utilized. However, it is considered that the weight reduction and improvement in function of the mobile terminal continue. As a result, it is necessary to make the memory area of a flash memory smaller.

SUMMARY OF THE INVENTION

It is an object of the present invention to provide a nonvolatile semiconductor memory device capable of reducing a memory area.

A nonvolatile semiconductor memory device according to the present invention includes a plurality of word lines, a plurality of bit lines, a plurality of nonvolatile memory cells, a plurality of latch circuits and a bit line select circuit. The plurality of word lines are arranged in rows. The plurality of bit lines are arranged in columns. The plurality of nonvolatile memory cells are arranged in the rows and the columns. The plurality of latch circuits are arranged to be electrically connected to the plurality of bit lines, and latch a plurality of pieces of data inputted externally. The bit line select circuit supplies a predetermined potential to the plurality of bit lines, and maintains potentials of the plurality of bit lines each supplied with the predetermined potential. The plurality of nonvolatile memory cells arranged in each of the rows are connected in series, and gates thereof are connected to the word line arranged in the row.

It is preferable that the bit line select circuit includes a plurality of bit line control circuits, a connection circuit and a predetermined potential generation circuit. The plurality of bit line control circuits are arranged to correspond to the plurality of bit lines, and control the potential supplied to the corresponding bit lines in response to the data latched by corresponding latch circuits. The connection circuit sequentially connects the plurality of latch circuits to the plurality of bit line control circuits in response to a clock signal. The predetermined potential generation circuit generates the potential supplied to the plurality of bit lines.

It is preferable that the plurality of nonvolatile memory cells includes: a plurality of normal nonvolatile memory cells; and a spare nonvolatile memory cell replacing a defective normal nonvolatile memory cell among the plurality of normal nonvolatile memory cells, that the plurality of bit lines includes: a plurality of normal bit lines; and a spare bit line connected to the spare nonvolatile memory cell, that the plurality of latch circuits include: a plurality of normal latch circuits arranged to correspond to the plurality of normal bit lines, respectively; and a spare latch circuit arranged to correspond to the spare bit line, that the nonvolatile semiconductor memory device further includes: an address counter, a redundancy circuit, a write circuit, and a data latch circuit. The address counter outputs an address signal. The redundancy processing circuit determines whether the address signal is consistent with a defective address signal indicating the defective normal nonvolatile memory cell. The write circuit sequentially writes the plurality of pieces of data to the plurality of latch circuits, respectively, in response to the address signal in a write operation. The data latch circuit latches the data inputted and outputted into and from the spare nonvolatile memory cell. The write circuit transmits the data to the data latch circuit when the address signal is consistent with the defective address signal as a result of determination of the redundancy processing circuit, and writes the data latched by the data latch circuit to the spare latch circuit when the address signal designates the spare latch circuit.

A semiconductor memory device according to the present invention includes: a memory cell array and a select circuit. The memory cell array includes a plurality of word lines arranged in rows, respectively, a plurality of bit lines arranged in columns, respectively, and a plurality of memory cells arranged in the rows and the columns, respectively. The select circuit selects one of the plurality of memory cells. In the memory cell array, a plurality of memory cells arranged in each of the rows are connected in series, gates of the plurality of memory cells are connected to the word line arranged in the row, each of the plurality of bit lines is connected to a plurality of memory cells arranged in the two adjacent columns, and the select circuit first selects the memory cell located at an end of the memory cell array.

A semiconductor memory device according to the present invention includes a plurality of normal memory cells, a spare memory cell, and a redundancy circuit. The redundancy circuit determines in which of the plurality of normal memory cells and the spare memory cell, each of a plurality of pieces of data inputted externally is stored, controls a write operation, reads the data stored in the spare memory cell, and then determines which of the data stored in the plurality of normal memory cells and the data stored in the spare memory cell is outputted.

The nonvolatile semiconductor memory device in accordance with the present invention enables reduction in chip area, as the adjacent nonvolatile memory cells in the memory share a bit line. Further, even in the memory cell array structure in which the adjacent nonvolatile memory cells in the memory share a bit line, data can be successively written to the nonvolatile memory cells.

BRIEF DESCRIPTION OF THE DRAWINGS

FIGS. 12A to 12D are typical views showing the operations of first and second predetermined potential generation circuits in the bit line select circuit shown in FIG. 11;

DESCRIPTION OF THE PREFERRED EMBODIMENTS

The embodiments of the present invention will be described hereinafter in detail with reference to the drawings. Same or corresponding constituent elements are denoted by the same reference symbols throughout the drawings and will not be repeatedly described.

First Embodiment

Figure 1:
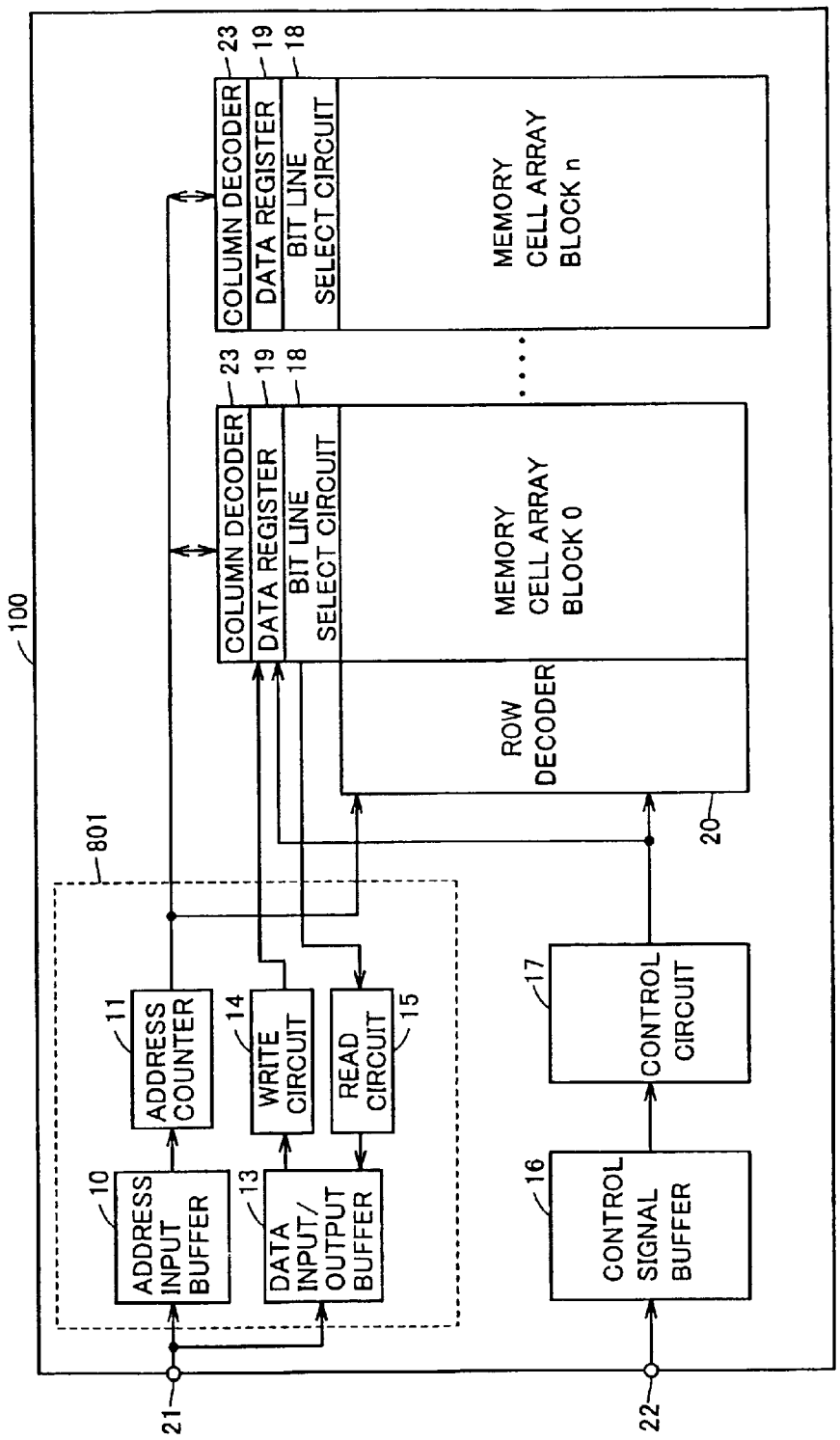
FIG. 1 is a schematic block diagram showing the configuration of a nonvolatile semiconductor memory device in the first embodiment of the present invention.

FIG. 1 is a schematic block diagram showing the configuration of a nonvolatile semiconductor memory device in the first embodiment according to the present invention.

Referring to FIG. 1, a nonvolatile semiconductor memory device 100 includes peripheral circuits 801, a control input buffer 16, a control circuit 17, a plurality of bit line select circuits 18, a plurality of data registers 19, a row decoder 20, a plurality of column decoders 23 and memory cell array blocks 0 to n (where n is a natural number).

Peripheral circuits 801 include an address input buffer 10, an address counter 11, a data input/output buffer 13, a write circuit 14 and a read circuit 15.

Address input buffer 10 receives an external address signal inputted from a data/address terminal group 21, and outputs an address block signal, a row address signal and a column address signal. The address signal is a signal which designates one of memory cell array blocks 0 to n. The row address signal selects a row on a memory cell array. The column address signal is a signal which designates a plurality of latch circuits which latch data before a write operation. It is noted that a plurality of latch circuits are arranged in data register 19.

Address counter 11 counts the column address signals of the memory cell array block designated by the address block signal, and outputs the counted column address signals.

Data input/output buffer 13 transmits and receives data to and from the outside through data/address terminal group 21. Write circuit 14 outputs a plurality of pieces of data outputted from data input/output circuit 13 in the write operation to data register 19. Read circuit 15 outputs a plurality of pieces of data read in a read operation to data input/output buffer 13.

Control signal buffer 16 receives an external control signal through an external control terminal group 22, and outputs an internal control signal. Control circuit 17 receives the internal control signal, and outputs a control signal to control the entirety of memory cell array blocks 0 to n.

Each of memory cell array blocks 0 to n includes a plurality of word lines arranged on rows, a plurality of bit lines arranged on columns, and a plurality of nonvolatile memory cells arranged in a matrix.

Row decoder 20 receives the row address signal and activates a word line. Data register 19 includes a plurality of latch circuits which latch data to be stored in nonvolatile memory cells connected to the activated word line. Column decoder 23 receives the column address signal in the write operation, and selects the latch circuits latching the data outputted from write circuit 14. Bit line select circuit 18 sequentially writes a plurality of pieces of data stored in the plurality of latch circuits in data register 19, to a plurality of nonvolatile memory cells or sequentially reads data from the plurality of nonvolatile memory cells.

Figure 2:
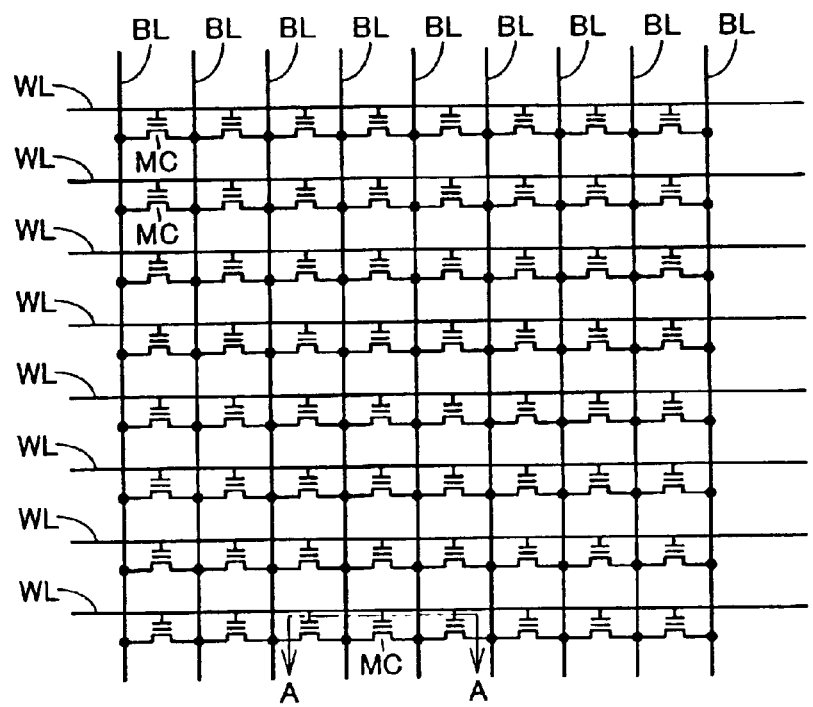
FIG. 2 is a circuit diagram showing the detailed configuration of a memory cell array block shown in FIG. 1.

FIG. 2 is a circuit diagram showing the detailed configuration of memory cell array block n shown in FIG. 1.

Referring to FIG. 2, memory cell array block n includes a plurality of nonvolatile memory cells MC, a plurality of word lines WL and a plurality of bit lines BL.

Plural word lines WL and plural bit lines BL are arranged on rows and columns, respectively.

Each of plural nonvolatile memory cells MC is arranged in a region surrounded by word lines WL and bit lines BL. A plurality of nonvolatile memory cells MC arranged to correspond to a plurality of regions located on the same row are connected in series and the gates of thereof are connected to the same word line WL. Each bit line BL is arranged so as to pass through each connection point between two adjacent nonvolatile memory cells MC.

Figure 3:
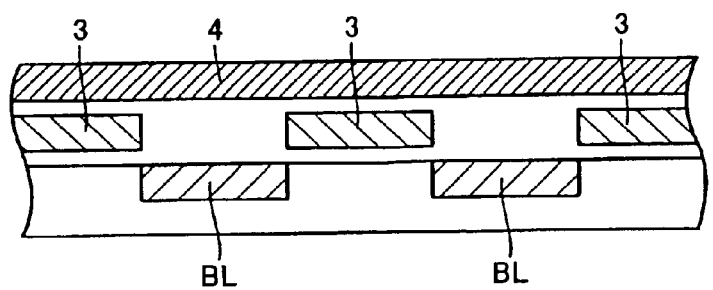
FIG. 3 is a cross-sectional view taken along line A—A of FIG. 2.

FIG. 3 is a cross-sectional view taken along line A—A of FIG. 2.

Referring to FIG. 3, nonvolatile semiconductor memory device MC consists of a control gate 4 (a word line in FIG. 2), a floating gate 3 and bit lines BL. Bit lines BL serve as source line 1 and drain line 2 shown in FIG. 17.

Figure 4:
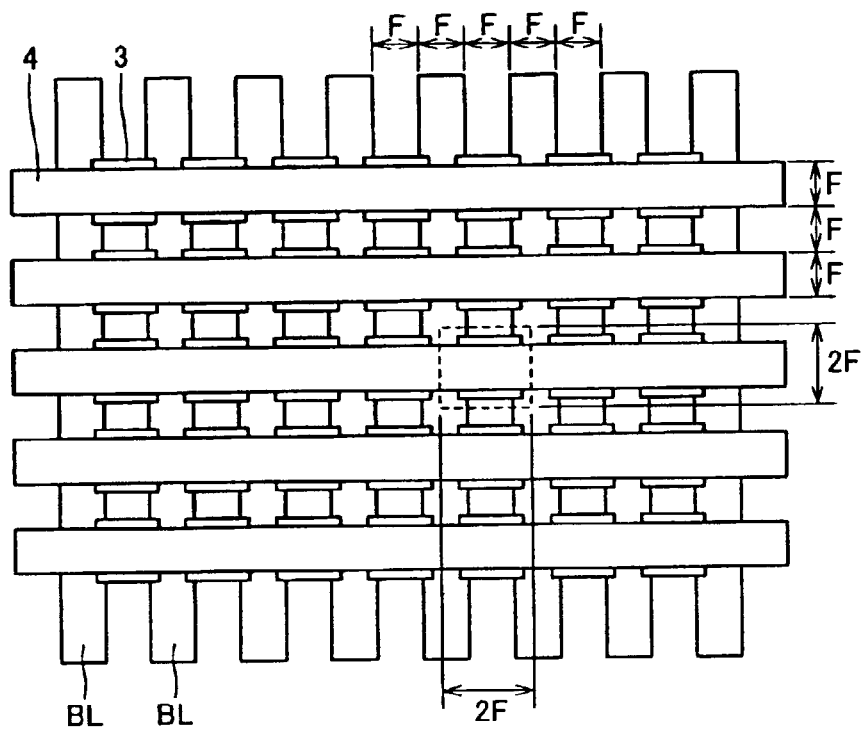
FIG. 4 is a partially enlarged plan view of the memory cell array block shown in FIG. 1.

FIG. 4 is a partially enlarged plan view of memory cell array block n shown in FIG. 1.

Figure 17:
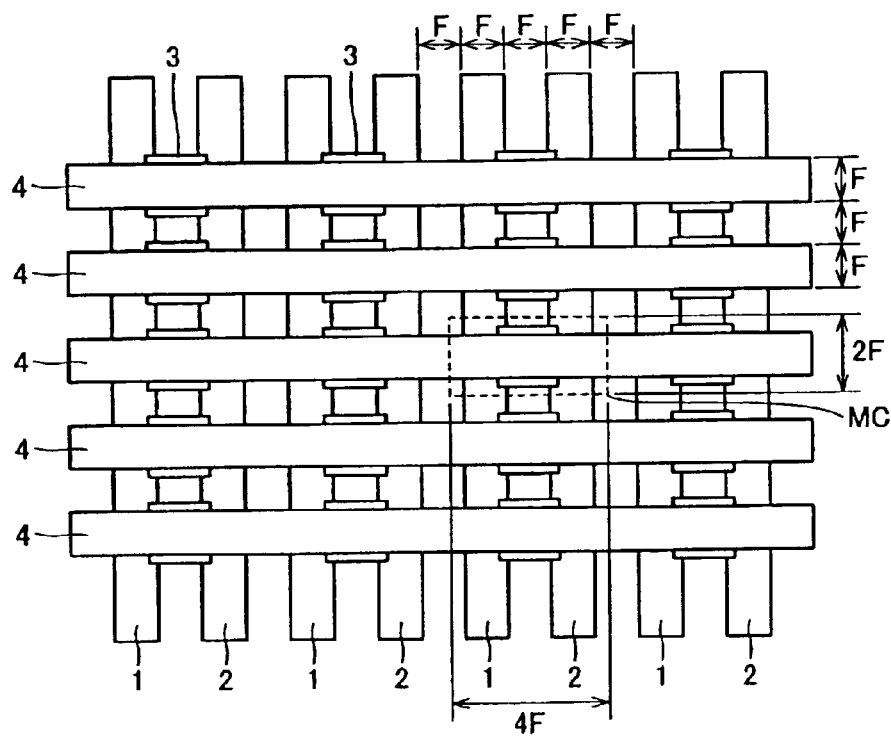
FIG. 17 is a partially enlarged plan view of the memory cell array of a conventional flash memory.

Referring to FIG. 4, in memory cell array block n, source line 1 and drain line 2 shown in FIG. 17 are set as bit lines BL in common. Therefore, if it is assumed that a minimum processed dimension is F, the memory cell area of memory cell MC is 2F×2F=4F². Consequently, the area of a memory cell array becomes half as large as that of the memory cell array of the conventional nonvolatile semiconductor memory device shown in FIG. 17.

Figure 5:
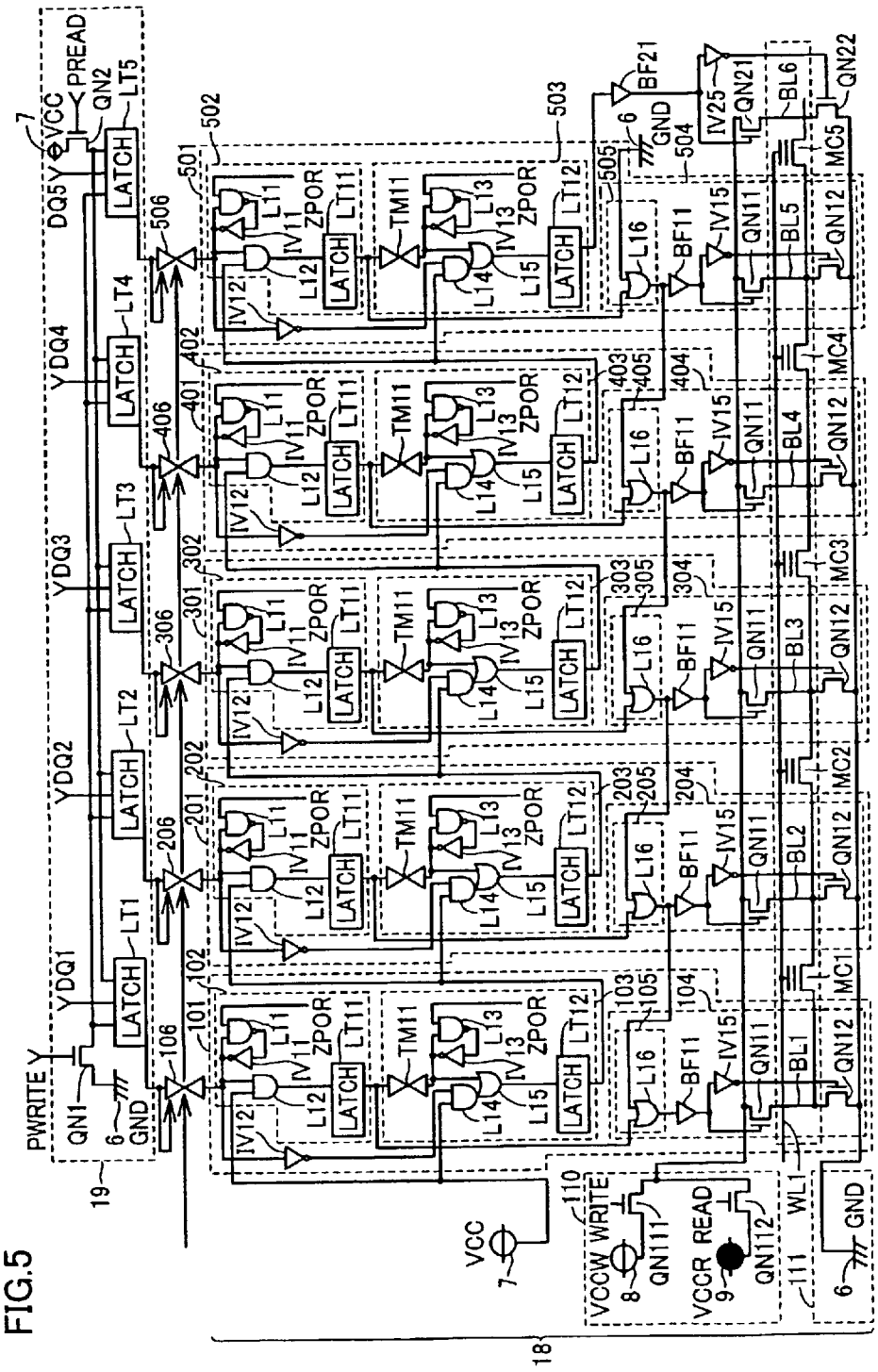
FIG. 5 is a circuit diagram showing the detailed configurations of a data register, a bit line select circuit and the memory cell array block shown in FIG. 1.

FIG. 5 is a circuit diagram showing the detailed configurations of data register 19, bit line select circuit 18 and memory array block n shown in FIG. 1.

Referring to FIG. 5, it is assumed that memory cell array block n consists of one word line WL1, nonvolatile memory cells MC1 to MC5 having gates connected to word line WL1, respectively, and bit lines BL1 to BL6 arranged to correspond to nonvolatile memory cells MC1 to MC5, respectively to simplify description.

Data register 19 includes latch circuits LT1 to LT5. Latch circuits LT1 to LT5 receive data signals DQ1 to DQ5 outputted from write circuit 14 in response to address counter 11, respectively.

In addition, each of latch circuits LT1 to LT5 is connected to the drain of an N channel MOS transistor QN1 and the source of an N channel MOS transistor QN2. The source of transistor QN1 is connected to a ground node 6. The drain of transistor QN2 is connected to an internal power supply node 7. The gate of transistor QN1 receives a write preparation signal PWRITE. Write preparation signal PWRITE is a signal which is outputted from control circuit 17 and which is activated for a predetermined period before a write operation. In addition, the gate of transistor QN2 receives a read preparation signal PREAD. Read preparation signal PREAD is a signal which is outputted from control circuit 17 and which is activated for a predetermined period before a read operation.

Latch circuit LT1 is connected to a bit line control circuit 101 through a shift clock circuit 106. Likewise, latch circuit LT2 is connected to a bit line control circuit 201 through a shift lock circuit 206, latch circuit LT3 is connected to a bit line control circuit 301 through a shift lock circuit 306, latch circuit LT4 is connected to a bit line control circuit 401 through a shift lock circuit 406, and latch circuit LT5 is connected to a bit line control circuit 501 through a shift lock circuit 506.

Figure 6:
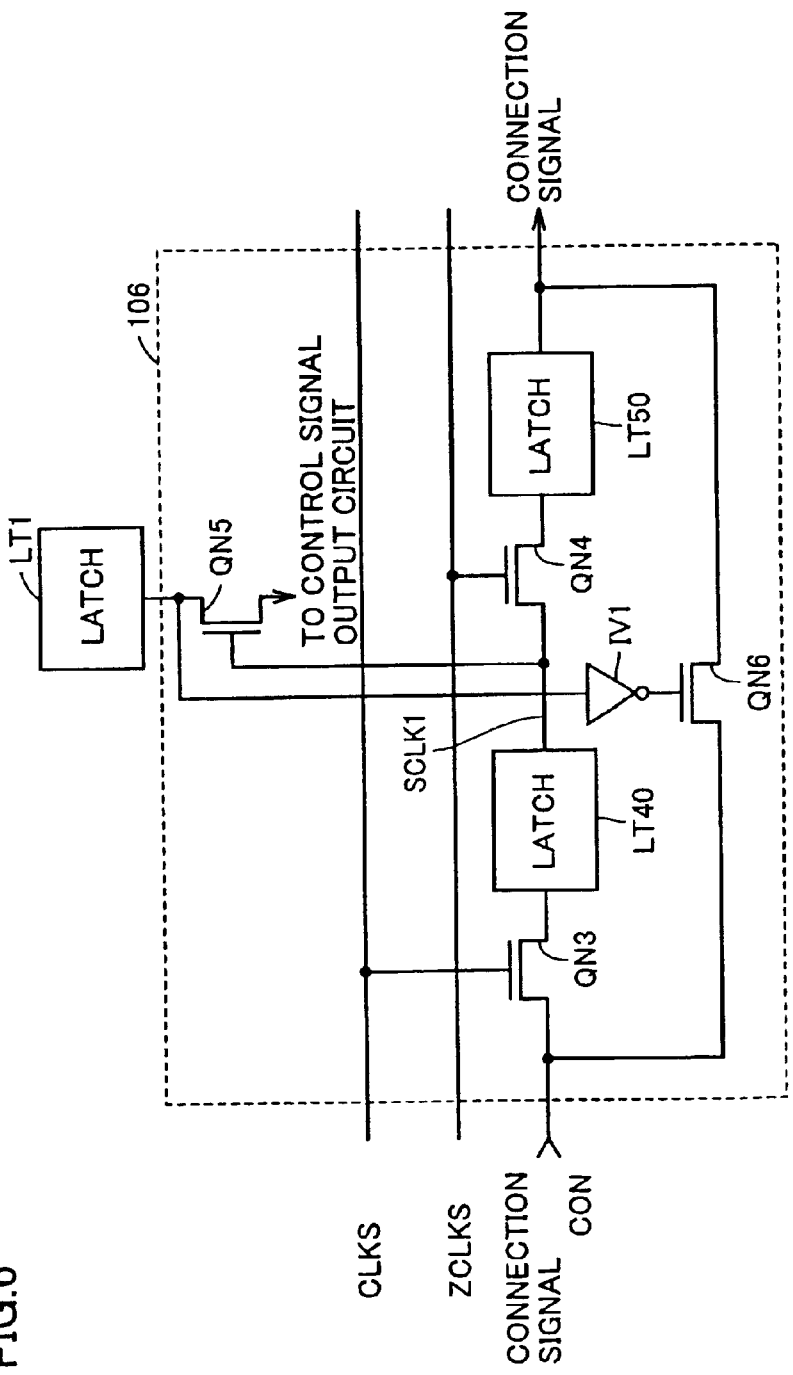
FIG. 6 is a circuit diagram showing the detailed configurations of the data register, the bit line select circuit and the memory cell array block shown in FIG. 1.

FIG. 6 is a circuit diagram showing the detailed configurations of data register 19, bit line select circuit 18 and memory cell block n shown in FIG. 1.

Referring to FIG. 6, shift clock circuit 106 includes latch circuits LT40 and LT50, and N channel MOS transistors QN3 to QN6.

Transistor QN3, latch circuit LT40, transistor QN4 and latch circuit LT50 are connected in series. The drain of transistor QN6 is connected to the drain of transistor QN3, and the source of transistor QN6 is connected to the output terminal of latch circuit LT50. A signal CLKS, which has half the cycle of a clock signal CLK outputted from control circuit 17, is inputted into the gate of transistor QN3, and a signal ZCLKS, which is complementary to signal CLKS, is inputted into the gate of transistor QN4. Transistor QN5 is connected between latch circuit LT1 and bit line control circuit 101, and the gate of transistor QN5 is connected to a connection point connecting latch circuit LT40 to transistor QN4. The gate of transistor QN6 is connected to the output terminal of an inverter IV1 and the input terminal of inverter IV1 is connected to the output terminal of latch circuit LT1.

The drain of transistor QN3 receives a connection signal CON outputted from control circuit 17. Connection signal CON is a one-shot pulse and the pulse width thereof is equal to that of clock signal CLK.

The operation of shift clock circuit 106 will next be described.

First, the operation of shift clock circuit 106 in a case where an H-level data signal is latched by latch circuit LT1 in data register 19.

In this case, a signal outputted from latch circuit LT1 is at H level and transistor QN6 is, therefore, turned off. Accordingly, if signal CLK is at H level, H-level connection signal CON is passed through transistor QN3 and inputted into latch circuit L40. At this moment, a shift clock signal SCLK1 outputted from latch circuit LT40 becomes H level and transistor QN5 is, therefore, turned on. As a result, latch circuit LT1 outputs an H-level data signal. If signal CLKS becomes L level, transistor QN3 is turned off and transistor QN4 is turned on. Therefore, latch circuit LT50 receives H-level shift clock signal SCLK1 outputted from latch circuit LT40. As a result, latch circuit LT50 outputs the H-level signal to shift clock circuit 206 in a rear stage. Next, if signal CLKS becomes H level again, transistor QN3 is turned on. However, since inputted connection signal CON is a one-shot pulse, transistor QN3 is at L level. Therefore, shift clock signal SCLK1 is not activated.

The operation of shift clock signal 106 in a case where no data is latched by latch circuit LT1 in data register 19, i.e., latch circuit LT1 latches an L-level data signal, will next be described.

In this case, the data signal outputted from latch circuit LT1 is at L level and transistor QN6 is, therefore, turned on. As a result, connection signal CON is passed through shift clock signal 106 and transmitted to shift clock circuit 206.

Since shift clock circuits 206, 306, 406 and 506 are the same in configuration as shift clock circuit 106 stated above, the circuit configurations of shift clock circuits 206, 306, 406 and 506 will not be repeatedly described herein. It is noted that transistor QN5 in each shift clock circuit is connected to a corresponding one of latch circuits LT3 to LT5.

Referring back to FIG. 5, bit line select circuit 18 includes a plurality of bit line control circuits 101, 201, 301, 401 and 501, a first predetermined potential generation circuit 110, and a second predetermined potential generation circuit 111.

Bit line control circuit 101 includes a control signal output circuit 102, an end determination circuit 103, and a switching circuit 104.

Control signal output circuit 102 includes a latch circuit LT11, logical gates L11 and L12 and inverters IV11 and IV12.

Logical gate L12 receives a data signal transmitted from latch circuit LT1 and an internal power supply node 7, and outputs an AND logical operation result. The output signal is inputted into latch circuit LT11. Latch circuit LT11 receives the signal outputted from logical gate L12 and outputs a control signal CONT1. In addition, logical gate L11 receives a data signal DQ1 and a power-on reset signal ZPOR outputted from latch circuit LT1, and outputs a NAND logical operation result. The output terminal of inverter IV11 is connected to one of the two input terminals of logical gate L11 which terminal receives data signal DQ1. The input terminal of inverter IV11 is connected to the output terminal of logical gate L11.

End determination circuit 103 includes a transmission gate TM11, logical gates L13 to L15 and inverters IV12 and IV13. Transmission gate TM11 is connected between latch circuit LT11 and logical gate L15. When clock signal CLK is at L level, transmission gate TM11 is turned on and transmits control signal CONT1 outputted from latch circuit LT11 to logical gate L15. Logical gate L15 receives control signal CONT1 and the output signal of logical gate L14, and outputs an OR logical operation result. Logical gate L14 has two input terminals. One of the two input terminals of logical gate L14 is connected to internal power supply node 7 and the other input terminal thereof is connected to the output terminal of inverter IV12. Logical gate L14 outputs an AND logical operation result. The input terminal of inverter IV12 is connected to the output terminal of latch circuit LT1 through shift clock circuit 106. The input terminal of inverter IV12 is also connected to the output terminal of inverter IV11.

A logical gate L13 has two input terminals. Power-on reset signal ZPOR is inputted into one of the input terminals of logical gate L13 and the output terminal of transmission gate TM11 is connected to the other input terminal thereof. The output terminal of logical gate L13 is connected to the input terminal of inverter IV13. Logical gate L13 outputs a NAND logical operation result. The output terminal of inverter IV13 is connected to one of the two input terminals of logical gate L13 which terminal is connected to transmission gate TM11. In addition, the output terminal of inverter IV13 is connected to one of the two input terminals of logical gate L15 which terminal is connected to transmission gate TM11.

When control signal CONT1 is at H level, latch circuit L12 receives the signal outputted from logical gate L15 and outputs an end determination signal FIN1 to bit line control circuit 201 in the rear stage after one cycle of clock signal CLK. In addition, when control signal CONT1 is at L level, latch circuit LT12 outputs end determination signal FIN1 soon after receiving the signal outputted from logical gate L15.

Switching circuit 104 includes a buffer circuit BF11, N channel MOS transistors QN11 and QN12, an inverter IV15, and a switching element activation circuit 105 which outputs a switching element activation signal SWACT1. Switching element activation signal SWACT1 is a signal which controls transistors QN11 and QN12.

Switching element activation circuit 105 consists of a logical gate L16. Logical gate L16 receives control signal CONT1 and a switching element activation signal SWACT2 outputted from bit line control circuit 201 in the rear stage, and outputs an OR logical operation result as switching element activation signal SWACT1. Buffer circuit BF11 receives switching element activation signal SWACT1 outputted from switching element activation circuit 105 and buffers switching element activation signal SWACT1. Transistor QN11, bit line BL1 and transistor QN12 are connected in series. The drain of transistor QN11 is connected to first predetermined potential generation circuit 110 and the source thereof is connected to bit line BL1. In addition, the drain of transistor QN12 is connected to bit line BL1 and the source thereof is connected to second predetermined potential generation circuit 111. The gate of transistor QN11 receives the output signal of buffer circuit BF11. The gate of transistor QN12 receives the output signal of inverter IV15. Inverter IV15 receives switching element activation signal SWACT1, inverts and outputs switching element activation signal SWACT1.

First predetermined potential generation circuit 110 includes N channel MOS transistors QN111 and QN112. The sources of both transistors QN111 and QN112 are connected to the drain of transistor QN11. In addition, the drain of transistor QN111 is connected to a node 8 which receives a write potential VCCW and the gate thereof receives a write control signal WRITE outputted from control circuit 17. Write potential VCCW is a potential supplied to each bit line BL in a write operation, and write control signal WRITE is a signal which is activated to H level in the write operation.

On the other hand, the drain of transistor QN112 is connected to a node 9 which receives a read potential VCCR and the gate thereof receives a read control signal READ outputted from control circuit 17. Read potential VCCR is a potential supplied to each bit line BL in a read operation, and read control signal READ is a signal activated to H level in the read operation.

Second predetermined potential generation circuit 111 is connected to the source o transistor QN12. Second predetermined potential generation circuit 111 is connected to a ground node 6.

Bit line control circuit 201 includes a control signal output circuit 202 which outputs a control signal CONT2, an end determination circuit 203 which outputs an end determination signal FIN2, and a switching circuit 204. Switching circuit 204 includes a switching element activation circuit 205 which activates a switching element activation signal SWACT2. Since the configuration of control signal output circuit 202 is the same as that of control signal output circuit 102, it will not be repeatedly described herein. It is noted, however, that the two input terminals of logical gate L12 in control signal output circuit 202 receive data signal DQ2 outputted from latch circuit LT2 through shift clock circuit 206 and end determination signal FIN1 outputted from end determination circuit 103 of bit line control circuit 101 in the prior stage. The configuration of end signal determination circuit 203 is the same as that of end determination circuit 103. However, logical gate L14 in end determination circuit 203 receives the output signal of inverter IV12 and end determination signal FIN1. The configuration of switching circuit 204 is the same as that of switching circuit 104. However, switching element activation circuit 205 receives a control signal CONT2 and a switching element activation signal SWACT3 which is outputted from a switching element activation circuit 305 of bit line control circuit 305 in the rear stage, and outputs switching element activation signal SWACT2. Switching element activation circuit 305 and switching element activation signal SWACT3 will be described later. Further, transistors QN11 and QN12 in switching circuit 204 are connected to a bit line BL2.

Since the remaining constituent elements of bit line control circuit 201 are the same as those of bit line control circuit 101, they will not be repeatedly described herein.

Bit line control circuit 301 includes a control signal output circuit 302 which outputs a control signal CONT3, an end determination circuit 303 which outputs an end determination signal FIN3 and a switching circuit 304. In addition, switching circuit 304 includes a switching element activation circuit 305 which outputs switching element activation signal SWACT3. Since the configuration of control signal output circuit 302 is the same as that of control signal output circuit 102, it will not be repeatedly described herein. However, the two input terminals of logical gate L12 in control signal output circuit 302 receive data signal DQ3 which is outputted from latch circuit LT3 through shift cock circuit 306, and end determination signal FIN2 which is outputted from end determination circuit 203 in the prior stage. Since the configuration of end signal determination circuit 303 is the same as that of end signal determination circuit 103, it will not be repeatedly described herein. However, logical gate L14 in end signal determination circuit 303 receives the output signal of inverter IV12 and end determination signal FIN2. In addition, the configuration of switching circuit 304 is the same as that of switching circuit 104. However, switching element activation circuit 305 receives control signal CONT3 and a switching element activation signal SWACT4 which is outputted from a switching element activation circuit 405 in the rear stage, and outputs switching element activation signal SWACT3. Switching element activation circuit 405 and switching element activation signal SWACT4 will be described later. Further, transistors QN11 and QN12 in switching circuit 304 are connected to a bit line BL3.

Since the remaining constituent elements of bit line control circuit 301 are the same as those of bit line control circuit 101, they will not be repeatedly described herein.

Bit line control circuit 401 includes a control signal output circuit 402 which outputs a control signal CONT4, an end determination circuit 403 which outputs an end determination signal FIN4, and a switching circuit 404. In addition, switching circuit 404 includes a switching element activation circuit 405 which outputs a switching element activation signal SWACT4. Since the configuration of control signal output circuit 402 is the same as that of control signal output circuit 102, it will not be repeatedly described herein. However, logical gate L12 in control signal output circuit 402 receives data signal DQ4 and end determination signal FIN3. The configuration of end determination circuit 403 is the same as that of end determination circuit 103. However, logical gate L14 in end determination circuit 403 receives the output signal of inverter IV12 and end determination signal FIN3. In addition, the configuration of switching circuit 404 is the same as that of switching circuit 104. However, switching element activation circuit 405 receives control signal CONT4 and switching element activation signal SWACT5 outputted from a switching element activation circuit 505 in the rear stage, and outputs switching element activation signal SWACT4. Switching element activation circuit 505 and switching element activation signal SWACT5 will be described later. Further, transistors QN11 and QN12 in switching circuit 404 are connected to a bit line BL4.

Since the remaining constituent elements of bit line control circuit 401 are the same as those of bit line control circuit 101, they will not be repeatedly described herein.

Bit line control circuit 501 includes a control signal output circuit 502 which outputs a control signal CONT5, an end determination circuit 503 which outputs an end determination signal FIN5, and a switching circuit 504. In addition, switching circuit 504 includes switching element activation circuit 505 which outputs switching element activation signal SWACT5. Since the configuration of control signal output circuit 502 is the same as that of control signal output circuit 102, it will not be repeatedly described herein. However, logical gate L12 in control signal output circuit 502 receive data signal DQ5 and end determination signal FIN4. The configuration of end determination circuit 503 is the same as that of end determination circuit 103. However, logical gate L14 in end determination circuit 503 receives the output signal of inverter IV12 and end determination signal FIN4. In addition, the configuration of switching circuit 504 is the same as that of switching circuit 104. However, control signal CONT5 is inputted into one of the two input terminals of logical gate L16 in switching element activation circuit 505. The other input terminal thereof is connected to ground node 6. Further, transistors QN11 and QN12 in switching circuit 504 are connected to a bit line BL5.

Since the remaining constituent elements of bit line control circuit 501 are the same as those of bit line control circuit 101, they will not be repeatedly described herein.

N channel MOS transistors QN21 and QN22 are connected to a bit line BL6. Transistor QN21 is connected between first predetermined potential generation circuit 110 and bit line BL6 and the gate of transistor QN21 is connected to the output terminal of a buffer circuit BF21. Further, transistor QN22 is connected between second predetermined potential generation circuit 111 and bit line BL6 and the gate of transistor QN22 is connected to the output terminal of buffer circuit BF21 through an inverter IV25. End determination signal FIN5 outputted from end determination circuit 503 is inputted into the input terminal of buffer circuit BF21.

The operation of bit line select circuit 18 having the above-mentioned configuration will be described.

First, the write operation of bit line select circuit 18 in a case where latch circuits LT1 to LT5 in data register 19 latch H-level data signals DQ1 to DQ5, respectively, will be described.

Figure 7:
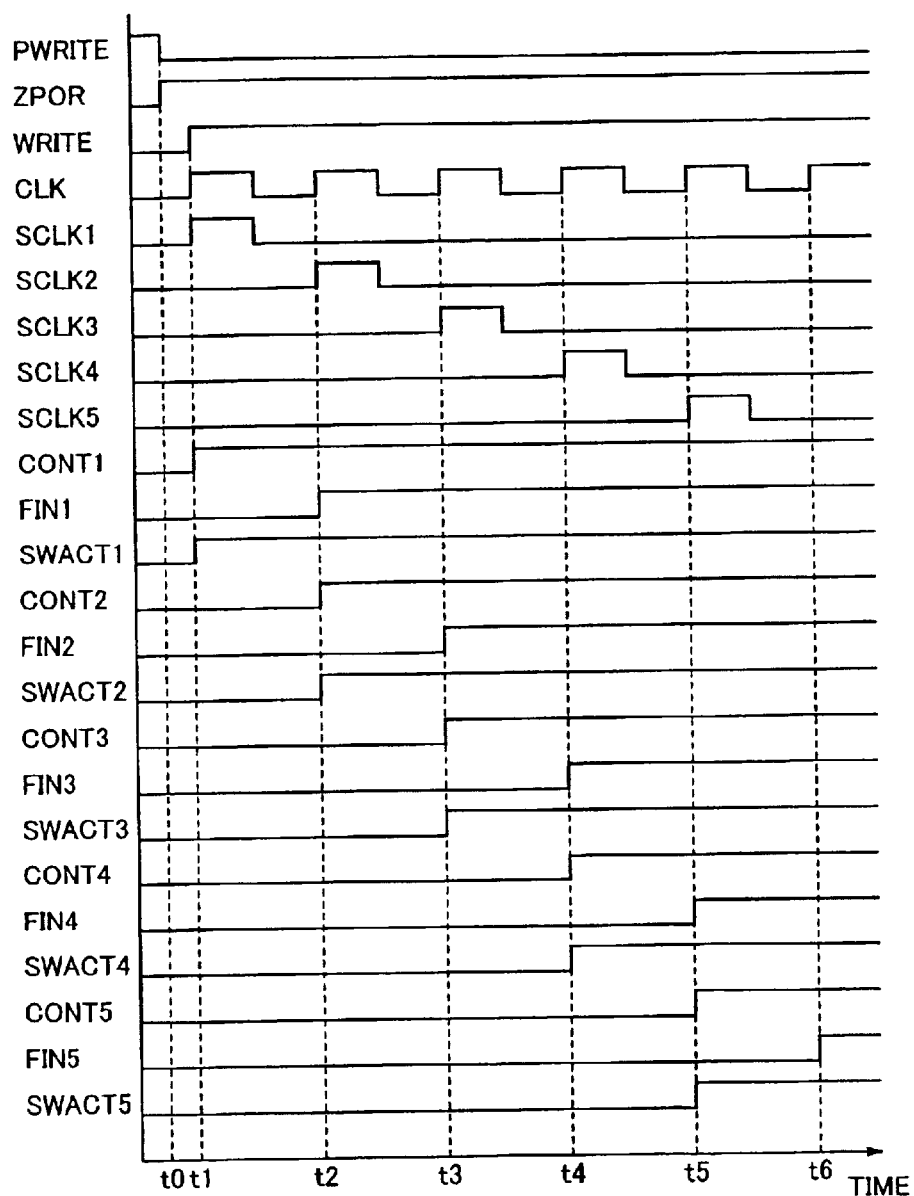
FIG. 7 is a timing chart showing the operation of the bit line select circuit in a case where all of a plurality of latch circuits in the data register shown in FIG. 5 latch H-level signals, respectively.

FIG. 7 is a timing chart showing the operation of bit line select circuit 18 if a plurality of latch circuits in data register 19 shown in FIG. 5 latch H-level signals, respectively.

Referring to FIG. 7, before time t0 which is time prior to the write operation, write preparation signal PWRITE outputted from control signal circuit 17 is at H level. Due to this, all of latch circuits LT1 to LT5 are at L level. In addition, before time t0, power-on reset signal ZPPOR is also at L level. Therefore, latch circuits LT11 and LT12 in each of bit line control circuits 101, 201, 301, 401 and 501 are at L level. As a result, control signals CONT1 to CONT5 respectively outputted from control signal output circuits 102, 202, 302, 402 and 502 are all at L level. At this moment, in each of switching circuits 105, 205, 305, 405 and 505, transistor QN11 is turned off and transistor QN12 is turned on. In addition, transistor QN21 connected to bit line BL6 is turned off and transistor QN22 is turned on. As a result, all bit lines BL1 to BL6 are maintained to be at L level.

During time t0 and time t1, H-level data is inputted from a write data input driver 14 into latch circuits LT1 to LT5, respectively. At this moment, latch circuits LT1 to LT5 latch H-level data signals DQ1 to DQ5, respectively.

At time t1, write control signal WRITE is activated to H level. At this moment, transistor QN11 in first predetermined potential generation circuit 110 is turned on and write potential VCCW is outputted.

At time t1, shift clock signal SCLK1 becomes H level in response to clock signal CLK. At this moment, transistor QN5 of shift clock circuit 106 is turned on and H-level data signal DQ1 is outputted from latch circuit LT1. Outputted data signal DQ1 is latched by latch circuit LT11 in control signal output circuit 102. At this moment, control signal output circuit 102 outputs H-level control signal CONT1. Due to this, switching element activation circuit 105 receives H-level control signal CONT1, and outputs H-level switching element activation signal SWACT1. As a result, transistor QN11 is turned on and transistor QN12 is turned off in switching circuit 104. Bit line BL2 is, by contrast, maintained to be at L level. Consequently, a potential difference occurs between the source and drain of nonvolatile memory cell MC1 and data signal DQ1 is stored in nonvolatile memory cell MC1.

In addition, at time t1, transmission gate TM11 in each end determination circuit is turned on. Therefore, latch circuit LT12 in end determination circuit 103 latches an H-level signal. Latch circuit LT12 latches a signal corresponding to one cycle of clock signal CLK and then outputs the signal. Consequently, at time t2, end determination circuit 103 outputs H-level end determination signal FIN1. On the other hand, latch circuit LT12 in each of remaining end determination circuits 203, 303, 403 and 503 keeps latching an L-level signal. Due to this, end determination signals FIN2 to FIN5 outputted therefrom are also kept to be at L level.

At time t2, clock signal CLK rises again to H level. Then, shift clock signal SCLK2 becomes H level and transistor QN5 in shift clock signal 206 is turned on. As a result, H-level data signal DQ2 which is latched by latch circuit LT2 is outputted at time t2. At this moment, logical gate L12 in control signal output circuit 202 receives H-level end determination signal FIN1 and H-level signal DQ2, and outputs an H-level signal. Accordingly, latch circuit LT11 latches an H-level signal. As a result, control signal output circuit 202 outputs H-level control signal CONT2.

Consequently, switching element activation circuit 205 receives H-level control signal CONT2, and outputs H-level switching element activation signal SWACT2. As a result, transistor QN11 is turned on and transistor QN12 is turned off in switching circuit 204. As a result, write potential VCCW is supplied to bit line BL2. Bit line BL3 is, by contrast, kept to be at L level. As a result, a potential difference occurs between the source and the drain of nonvolatile memory cell MC2 and data signal DQ2 is stored in nonvolatile memory cell MC2. At this moment, since transistor QN11 is kept to be turned on and transistor QN12 is kept to be turned off in switching circuit 104 in the prior stage, bit line BL1 is kept to have write potential VCCW. Therefore, both bit lines BL1 and BL2 to which nonvolatile memory cell MC1 is connected are kept to have write potential VCCW. As a result, at time t2, no potential difference occurs between the source and the drain of nonvolatile memory cell MC1 and the data stored in non-volatile memory cell MC1 is held as it is.

Further, at time t2, transmission gate TM11 in each end determination circuit is turned on. Due to this, latch circuit TL12 in end determination circuit 203 latches an H-level signal. Latch circuit LT12 outputs the latched signal after the passage of one cycle of clock signal CLK. At time t3, therefore, end determination circuit 203 outputs H-level end determination signal FIN2.

Likewise, at time t3, when clock signal CLK rises to H level, shift clock signal SCLK3 becomes H level and transistor QN5 in shift clock circuit 306 is turned on. At this moment, logical gate L12 in control signal output circuit 302 receives H-level end determination signal FIN2 and H-level data signal DQ3. As a result, control signal output circuit 302 outputs H-level control signal CONT3. Switching element activation circuit 305, therefore, outputs H-level switching element activation signal SWACT3. At this moment, transistor QN11 is turned on and transistor QN12 is turned off in switching circuit 304. As a result, write potential VCCW is supplied to bit line BL3. Since bit line BL4 is, by contrast, kept to be at L level, data signal DQ3 is stored in nonvolatile memory cell MC3.

At this moment, both bit lines BL1 and BL2 are kept to have write potential VCCW. As a result, at time t3, no potential difference occurs between the source and the drain of each of nonvolatile memory cells MC1 and MC2 and the data stored in nonvolatile memory cells MC1 and MC2 are held therein as they are.

In addition, at time t3, transmission gate TM11 in each end determination circuit is turned on. At time t4, end determination circuit 303 outputs H-level end determination signal FIN3.

The operation of bit line control circuit 401 at time t4 is the same as that of bit line control circuit 301 at time t3. That is, at time t4, shift clock signal SCLK4 rises and H-level control signal CONT4 is outputted. As a result, H-level switching element activation signal SWACT4 is outputted and write potential VCCW is supplied to bit line BL4. Therefore, nonvolatile memory cell MC4 stores data signal DQ4. Since bit lines BL1 to BL3 are also kept to have write potential VCCW at this moment, nonvolatile memory cells MC1 to MC3 hold their respective data. Further, at time t5, end determination circuit 403 outputs H-level end determination signal FIN4.

The operation of bit line control circuit 501 at time t5 is the same as that of bit line control circuit 401, as well. That is, at time t5, shift clock signal SCLK5 rises and H-level control signal CONT5 is outputted. As a result, H-level switching element activation signal SWACT5 is outputted and write potential VCCW is supplied to bit line BL5. As a result, nonvolatile memory cell MC5 stores data signal DQ5. Since bit lines BL1 to BL4 are also maintained to have write potential VCCW, nonvolatile memory cells MC1 to MC4 hold their respective data.

Furthermore, at time t6, end determination circuit 503 outputs H-level end determination signal FIN5. At this moment, end determination signal FIN5 is inputted into the gate of transistor QN21 connected to bit line BL6 through buffer circuit BF21. As a result, transistor QN21 is turned on. In addition, end determination signal FIN5 is inputted into the gate of transistor QN22 through inverter IV25. As a result, transistor QN22 is turned off. Consequently, at time t6 at which the entire write operation is finished, write potential VCCW is supplied to all bit lines BL1 to BL6. As a result, no potential difference occurs between the source and the drain of each of nonvolatile memory cells MC1 to MC5 and nonvolatile memory cells MC1 to MC5 hold the data stored therein, respectively.

Through the above-mentioned operation, in the memory cell array having a configuration in which bit line BL is common to two adjacent nonvolatile memory cells MC, data is written to each nonvolatile memory cell MC by the operation of bit line select circuit 18.

Next, the write operation in a case where some of a plurality of latch circuits in data register 19 latch L-level data signals, respectively, will be described.

Figure 8:
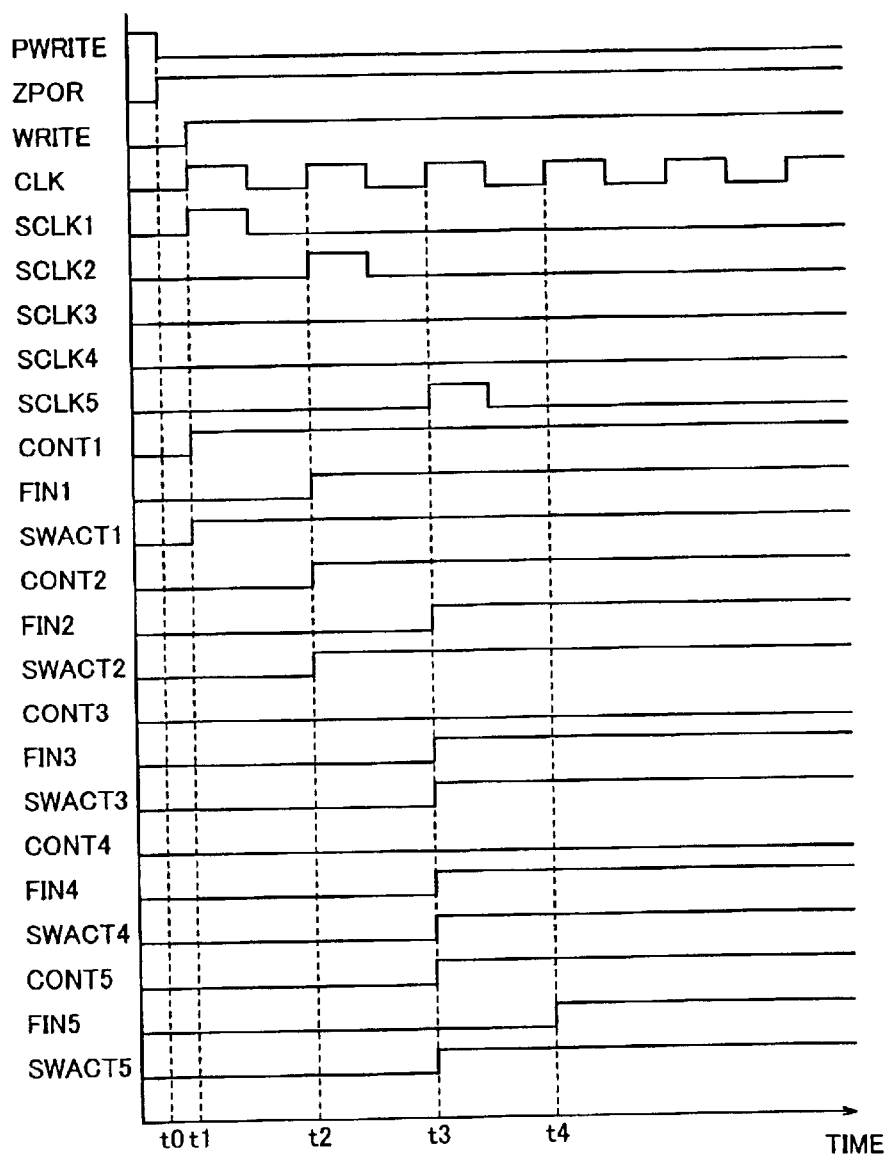
FIG. 8 is a timing chart showing the operation of the bit line select circuit in a case where some of a plurality of latch circuits in the data register shown in FIG. 5 latch L-level signals, respectively.

FIG. 8 is a timing chart showing the operation of bit line select circuit 18 if some of a plurality of latch circuits in data register 19 latch L-level data signals, respectively.

It is assumed herein that among data signals DQ1 to DQ5, data signals DQ3 and DQ4 are at L level and the other data signals DQ1, DQ2 and DQ5 are at H level.

Referring to FIG. 8, the operation of bit line select circuit 18 will be described. It is noted, however, since the operation thereof before time t0 is the same as that shown in FIG. 7, it will not be repeatedly described herein.

During time t0 and time t1, data is inputted into latch circuits LT1 to LT5 from write data input driver 14, respectively. At this moment, latch circuits LT1, LT2 and LT5 latch H-level data signals DQ1, DQ2 and DQ5, respectively. In addition, latch circuits LT3 and LT4 latch L-level data signals DQ3 and DQ4, respectively.

Since the operation of end determination circuit 203 from time t1 to time t2 and that at time t3 are the same as the operation of end determination circuit 203 from time t1 to time t2 and that at time t3 shown in FIG. 7, respectively, they will not be repeatedly described herein.

Since data signal DQ3 latched by latch circuit LH3 is at L level, transistor QN6 in shift clock circuit 306 is turned on.

Likewise, since data signal DQ4 latched by latch circuit LT4 is at L level, transistor QN6 in shift clock circuit 406 is turned on. Therefore, shift clock signal SCLK2 outputted from shift clock circuit 206 is inputted into shift clock circuit 506 at time t3. At time t3, therefore, transistor QN5 is turned on in shift clock circuit 506. As a result, at time t3, H-level data signal DQ5 latched by latch circuit LT5 is outputted.

On the other hand, at time t3, end determination signal FIN2 outputted from end determination circuit 203 is inputted into logical gate L14 in end determination circuit 303. While the output signal of inverter IV12 is inputted into the other input terminal of logical gate L14, the output signal of inverter IV12 is at H level at time t3. This is because transistor QN5 in shift clock circuit 306 is turned off and a signal inputted into inverter IV12 is at L level. At time t3, therefore, logical gate L14 outputs an H-level signal. As a result, end determination circuit 303 outputs H-level end determination signal FIN3 at time t3. Likewise, end determination circuit 403 outputs H-level end determination signal FIN4 at time t3.

At time t3, H-level data signal DQ5 and H-level end determination signal FIN4 are inputted into logical gate L12 in control signal output circuit 502 thereby outputting an H-level signal. As a result, control signal output circuit 502 outputs H-level control signal CONT5. Therefore, H-level control signal CONT5 is inputted into logical gate L16 in switching element activation circuit 505 in switching circuit 504. Logical gate L16, therefore, outputs H-level switching element activation signal SWACT5. At this moment, switching element activation signal SWACT5 is also inputted into switching element activation circuit 405 in the prior stage and switching element activation signal SWACT4 becomes H level. In addition, since switching element activation signal SWACT4 is inputted into switching element activation circuit 305 in the prior stage, switching element activation signal SWACT3 becomes H level at time t3. At time t3, therefore, transistor QN11 in switching circuit 304, transistor QN11 in witching element 404 and transistor QN11 in witching element 504 are simultaneously turned on. Accordingly, write potential VCCW is supplied to bit lines BL3, BL4 and BL5, simultaneously. As a result, no potential difference occurs between the source and the drain of nonvolatile memory cell MC3 and nonvolatile memory cell MC3 does not, therefore, operate. Nonvolatile memory cell MC4 does not operate, either. Write potential VCCW is supplied to bit line BL5. However, since bit line BL6 is kept to have a ground potential, nonvolatile memory cell MC5 stores data signal DQ5.

At time t4, end determination circuit 503 outputs H-level end determination signal FIN5. As a result, transistor QN22 is turned off and transistor QN21 is turned on. Consequently, no potential difference occurs between the source and the drain of nonvolatile memory cell MC5 and the write operation of wiring data to nonvolatile memory cell MC5 is finished.

Through the above-mentioned operation, in the memory cell array having a configuration in which bit line BL is common to two adjacent nonvolatile memory cells MC, even if some of a plurality of latch circuits in the data register latch L-level data signals, respectively, the bit line select circuit can sequentially write data to nonvolatile memory cells MC.

The read operation of bit line select circuit 18 will next be described.

In the read operation, before time t0 shown in FIG. 7, read preparation signal PREAD is active. At this moment, therefore, all of latch circuits LT1 to LT5 latch H-level signals, respectively. Next, at time t1, read control signal READ instead of write control signal WRITE is activated to H level. At this moment, transistor QN112 in first predetermined potential generation circuit 110 is turned on and read potential VCCR is outputted.

Since the operation before time t1 is the same as that shown in FIG. 7, it will not be repeatedly described herein. It is noted that if data is read by applying a potential differences to each of nonvolatile memory cells MC1 to MC5, data read is performed by a sense amplifier which is not shown.

Through the above-mentioned operation, in the memory cell array having a configuration in which bit lines BL is common to two adjacent nonvolatile memory cells MC, it is possible to perform a write operation and a read operation. It is, therefore, possible to provide a nonvolatile semiconductor memory device capable of reducing an area occupied by memory cell arrays.

Second Embodiment

In the first embodiment, the operation of bit line select circuit 18 in a case where the nonvolatile memory cells each of which stores one-bit data are employed, has been described.

However, a nonvolatile memory cell which stores two-bit data has recently appeared and such a nonvolatile memory cell is reported in U.S. Pat. No. 6,011,725. This nonvolatile memory cell will be referred to as "binary storage type nonvolatile memory cell" hereinafter.

The overall configuration of a nonvolatile semiconductor memory device which employs binary storage type nonvolatile memory cells is the same as that shown in FIG. 1.

Figure 9:
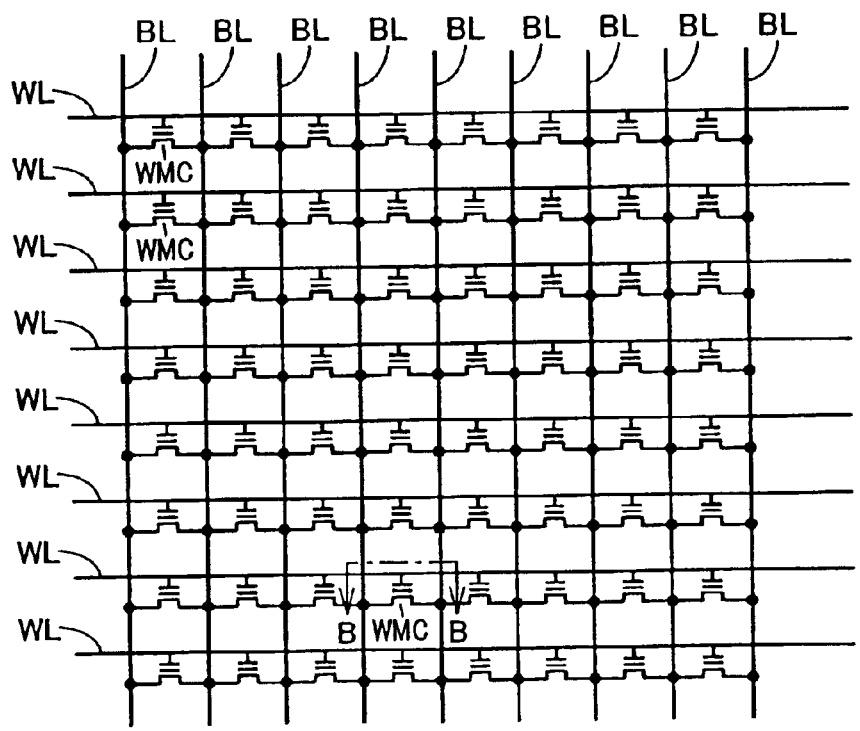
FIG. 9 is a circuit diagram showing the detailed configuration of a memory cell array n shown in FIG. 1 if binary storage type nonvolatile semiconductor memory device cells are employed.

FIG. 9 is a circuit diagram showing the detailed configuration of memory cell array n shown in FIG. 1 if binary storage type nonvolatile memory cells are employed.

Referring to FIG. 9, the configuration of memory cell array n in FIG. 1 in which the binary storage type nonvolatile memory cells are employed, differs from that shown in FIG. 2 in that binary storage type nonvolatile memory cells WMC are arranged in place of nonvolatile memory cells MC. Since the remaining constituent elements of memory array n are the same as those shown in FIG. 2, they will not be repeatedly described herein.

Figure 10:
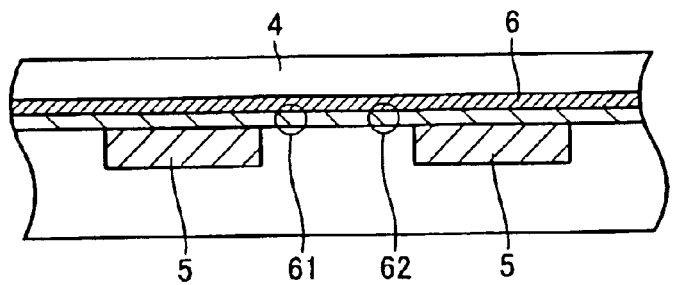
FIG. 10 is a cross-sectional view taken along line B—B of FIG. 9.

FIG. 10 is a cross-sectional view taken along line B—B of FIG. 9.

Binary storage type nonvolatile memory cell WMC shown in FIG. 10 differs from memory cell MC shown in FIG. 3 in that a nitride film 6 instead of floating gate 3 is included. In addition, binary storage type nonvolatile memory cell WMC includes a first data storage section 61 and a second data storage section 62 which are provided right under nitride film 6.

Figure 11:
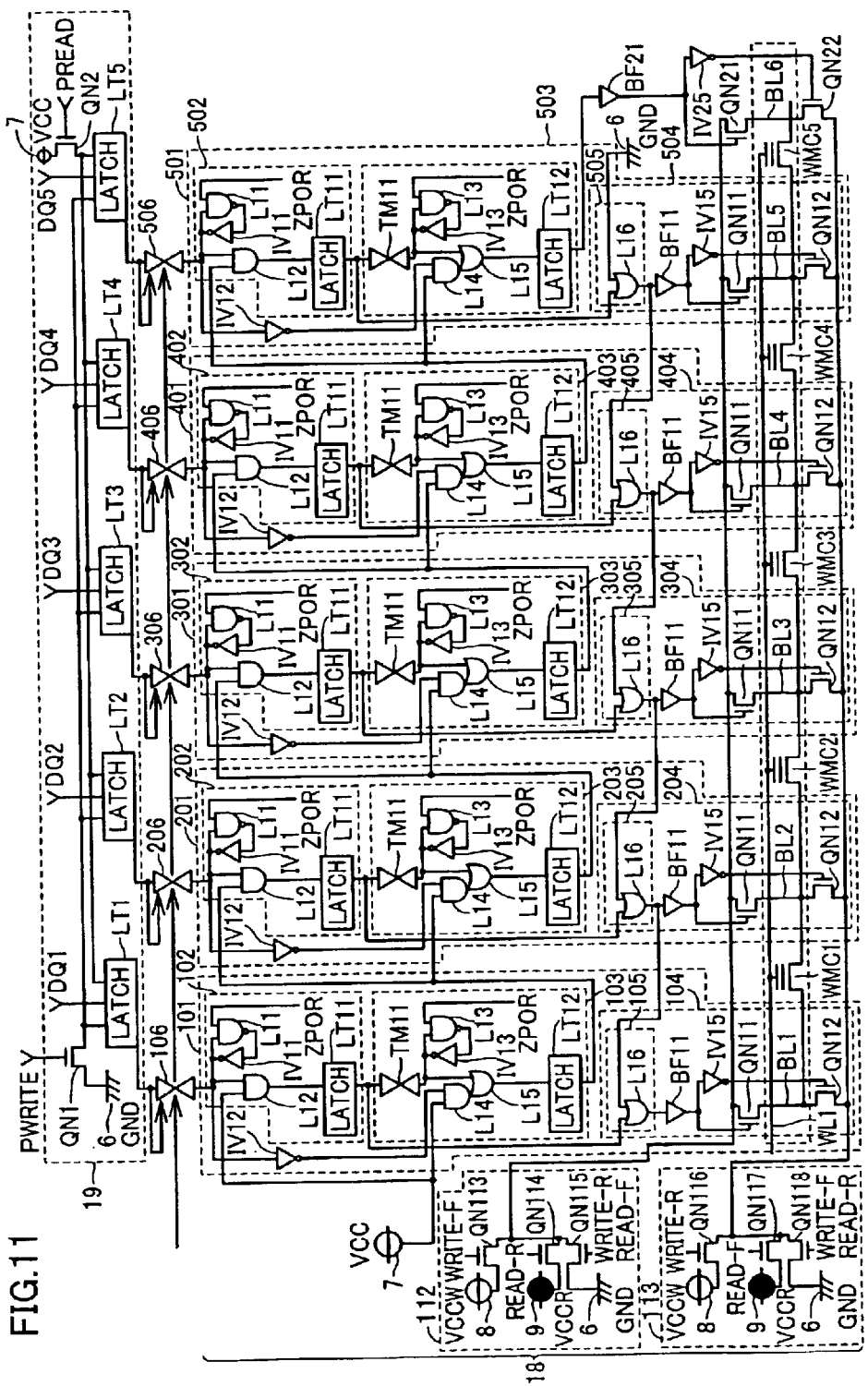
FIG. 11 is a circuit diagram showing the detailed configurations of a data register, a bit line select circuit and memory cell array block n if binary storage type nonvolatile semiconductor memory device cells are employed.

FIG. 11 is a circuit diagram showing the detailed configurations of data register 19, bit line select circuit 18 and memory cell array block n shown in FIG. 1 if binary storage type nonvolatile memory cells are employed.

Referring to FIG. 11, bit line select circuit 18 differs from that shown in FIG. 5 in that a first predetermined potential generation circuit 112 instead of first predetermined potential generation circuit 111 and a second predetermined potential generation circuit 113 instead of second predetermined potential generation circuit 111 are arranged. In addition, binary storage type nonvolatile memory cells WMC1 to WMC5 are arranged in place of nonvolatile memory cells MC1 to MC5, respectively.

Since the remaining circuit configurations are the same as those shown in FIG. 5, they will not be repeatedly described herein.

First predetermined potential generation circuit 112 includes N channel MOS transistors QN113 to QN115. The drain of transistor QN113 is connected to write potential node 8, and the source thereof is connected to the drain of transistor QN11 in each of switching circuits 104, 204, 304, 404 and 504. A forward write signal WRITE-F is inputted into the gate of transistor QN113. Forward write signal WRITE-F is a signal which is outputted from control circuit 17 when data is written to the first storage region of binary storage type nonvolatile memory cell WMC. The drain of transistor QN114 is connected to a read potential node VCCR, and the source thereof is connected to the drain of transistor QN11 in each of switching circuits 104, 204, 304, 404 and 504. A reverse read signal READ-R is inputted into the gate of transistor QN114. Reverse read signal READ-R is a signal which is outputted from control circuit 17 when data is read from the second storage region of binary storage type nonvolatile memory cell WMC. Transistor QN115 is connected between ground node 6 and transistor QN11 and a reverse write signal WRITE-R or a forward read signal READ-F is inputted into the gate of transistor QN115. Reverse write signal WRITE-R is a signal which is outputted from control circuit 17 when data is written to the second storage region of binary storage type nonvolatile memory cell WMC. Forward read signal READ-F is a signal which is outputted from control circuit 17 when data is read from the first storage region of binary storage type nonvolatile memory cell WMC.

Second predetermined potential generation circuit 113 includes N channel MOS transistors QN116 to QN118. Transistor QN116 is connected between write potential node 8 and transistor QN12 in each of switching circuits 104, 204, 304, 404 and 504. Reverse write signal WRITE-R is inputted into the gate of transistor QN116. Transistor QN117 is connected between read potential node 9 and transistor QN12 in each of switching circuits 104, 204, 304, 404 and 504. Forward read signal READ-F is inputted into the gate of transistor QN117. Transistor QN118 is connected between ground node 6 and transistor QN12 in each of switching circuits 104, 204, 304, 404 and 504 and forward write signal WRITE-F or reverse read signal READ-R is inputted into the gate of transistor QN118.

The operation of bit line select circuit 18 having the above-mentioned configuration will next be described.

Since the forward write operation and reverse write operations of the circuits in bit line select circuit 18 with the configuration shown in FIG. 11 are the same as the write operation of bit line select circuit 18 shown in FIG. 5 except for the operations of first predetermined potential generation circuit 112 and second predetermined potential generation circuit 113, they will not be repeatedly described herein. In addition, the forward read operation and reverse read operation of the circuits in bit line select circuit 18 with the configuration shown in FIG. 11 are the same as the read operation of bit line select circuit 18 shown in FIG. 18 except for the operations of first predetermined potential generation circuit 112 and second predetermined potential generation circuit 113, they will not be repeatedly described herein.

Accordingly, the operation of first predetermined potential generation circuit 112 and second predetermined potential generation circuit 113 in bit line select circuit 18 will be described hereinafter.

FIGS. 12A to 12D are typical views showing the operations of first predetermined potential generation circuit 112 and second predetermined potential generation circuit 113 in bit line select circuit 18 shown in FIG. 11.

First, the operation of first predetermined potential generation circuit 112 and second predetermined potential generation circuit 113 in a forward write operation will be described.

Referring to FIG. 12A, in the forward write operation, H-level forward write signal WRITE-F is outputted from control circuit 17. Transistor QN113 in first predetermined potential generation circuit 112 is, therefore, turned on. As a result, first predetermined potential generation circuit 112 outputs write potential VCCW to a node N1. At this moment, transistor QN118 in second predetermined potential generation circuit 113 is turned on. A node N2 is, therefore, kept to have a ground potential GND. Consequently, in the forward write operation, a current is carried from node N1 kept to have write potential VCCW to node N2 kept to have ground potential GND through memory cell WMC and data DQ is stored in the first storage region of memory cell WMC.

The operation of first predetermined potential generation circuit 112 and second predetermined potential generation circuit 113 in a forward read operation will next be described.

Referring to FIG. 12B, in the forward read operation, H-level forward read signal READ-F is outputted from control circuit 17. Transistor QN115 in first predetermined potential generation circuit 112 is, therefore, turned on. As a result, node N1 is kept to have ground potential GND. At this moment, transistor QN117 in second predetermined potential generation circuit 113 is turned on. Node 2 is, therefore, kept to have read potential VCCR. Consequently, in the forward read operation, a current is carried from node N2 kept to have read potential VCCR to node N1 kept to have ground potential GND through memory cell WMC and data DQ stored in the first data storage region of memory cell WMC is read.

The operation of first predetermined potential generation circuit 112 and second predetermined potential generation circuit 113 in a reverse write operation will next be described.

Referring to FIG. 12C, in the reverse write operation, H-level reverse write signal WRITE-R is outputted from control circuit 17. Transistor QN115 in first predetermined potential generation circuit 112 is, therefore, turned on. As a result, node N1 is kept to have ground potential GND. At this moment, transistor QN116 in second predetermined potential generation circuit 113 is turned on. Node N2 is, therefore, kept to have write potential VCCW. Consequently, in the reverse write operation, a current is carried from node N2 kept to have write potential VCCW to node N1 kept to have ground potential GND through memory cell WMC and data DQ is stored in the second data storage region of memory cell WMC.

The operation of first predetermined potential generation circuit 112 and second predetermined potential generation circuit 113 in a reverse read operation will next be described.

Referring to FIG. 12D, in the reverse read operation, H-level reverse read signal READ-R is outputted from control circuit 17. Transistor QN114 in first predetermined potential generation circuit 112 is, therefore, turned on. As a result, first predetermined potential generation circuit 112 outputs read potential VCCR to node N1. At this moment, transistor QN118 in second predetermined potential generation circuit 113 is turned on. Node N2 is, therefore, kept to have ground potential GND. Consequently, a current is carried from node N1 kept to have read potential VCCR to node N2 kept to have ground potential GND through memory cell WMC and data DQ stored in the second storage region of memory cell WMC is read.

Through the above-mentioned operations, even with the configuration of the memory cell array which employs binary storage type nonvolatile memory cells WMC, the bit line select circuit can perform a data write operation and a data read operation with respect to the first and second data storage regions of each of binary storage type memory cells WMC.

Third Embodiment

Figure 13:
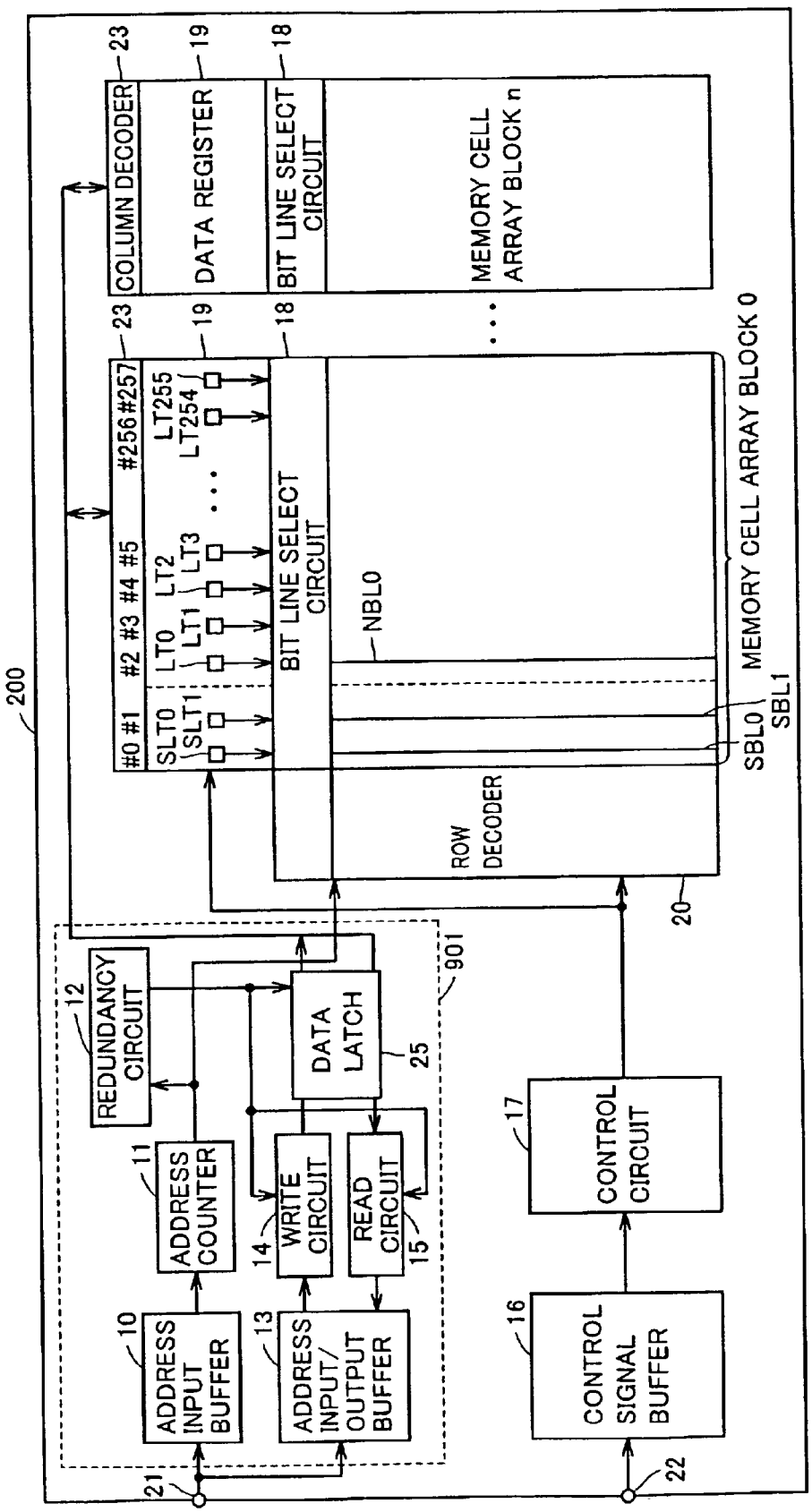
FIG. 13 is a schematic block diagram showing the overall configuration of a nonvolatile semiconductor memory device in the third embodiment according to the present invention.

FIG. 13 is a schematic block diagram showing the overall configuration of a nonvolatile semiconductor memory device in the third embodiment according to the present invention.

Referring to FIG. 13, peripheral circuits 901 in a nonvolatile semiconductor memory device 200 include a redundancy circuit 12 and a data latch circuit 25 compared with peripheral circuits 801 in nonvolatile semiconductor memory device 100 shown in FIG. 1.

In addition, each of memory array blocks 0 to n includes 256 normal bit lines NBL0 to NBL255 and two spare bit lines SBL0 and SBL1.

Data register 19 includes latch circuits LT0 to LT255 corresponding to normal bit lines NBL0 to NBL255, respectively. Data register 19 also includes latch circuits SLT0 and SLT1 corresponding to spare bit lines SBL0 and SBL1, respectively.

Since the remaining constituent elements of nonvolatile semiconductor memory device 200 are the same as those of semiconductor memory device 100 shown in FIG. 1, they will not be repeatedly described herein.

Figure 14:
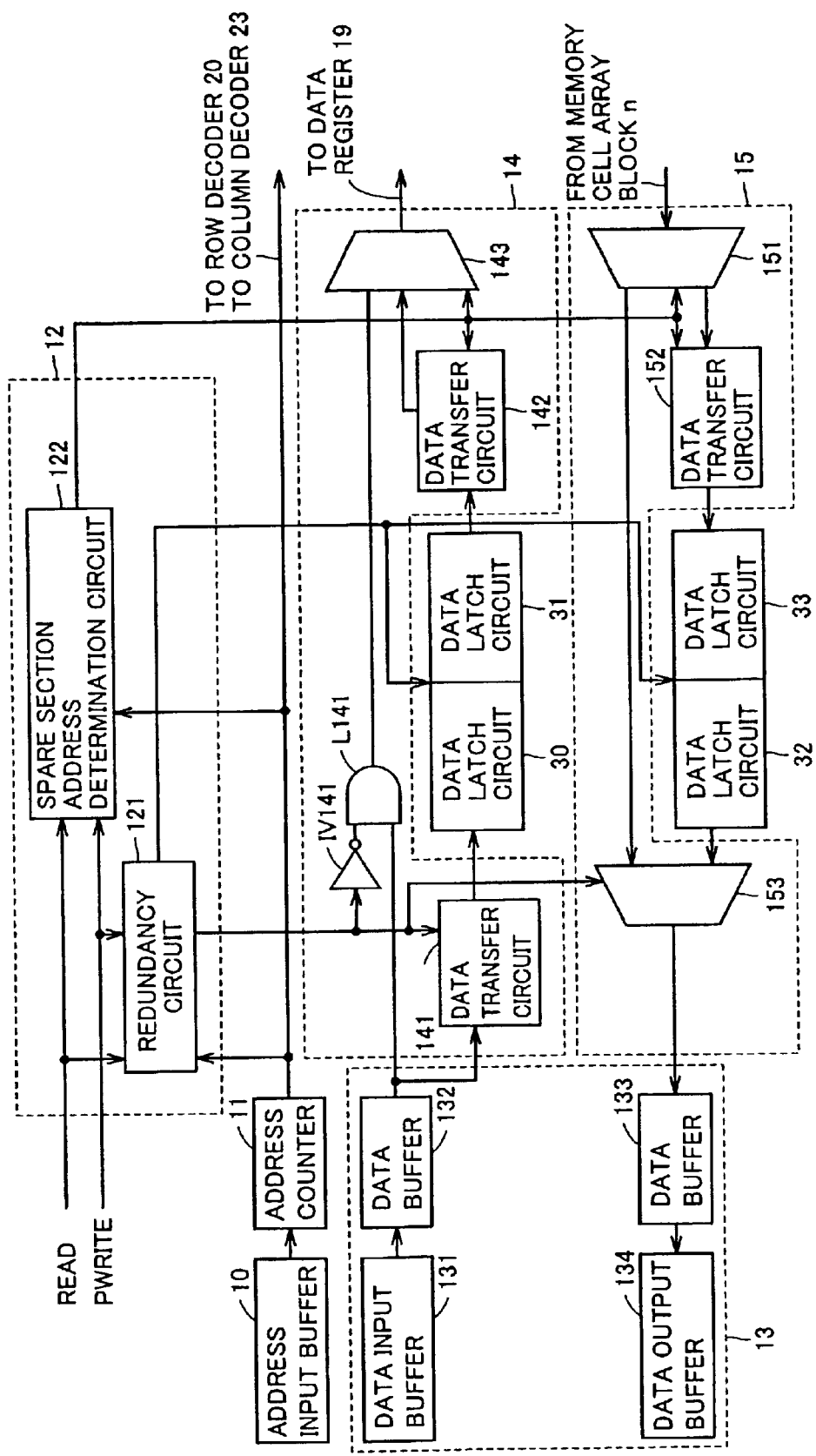
FIG. 14 is a block diagram showing the detailed configuration of peripheral circuits shown in FIG. 13.

FIG. 14 is a block diagram showing the detailed configurations of peripheral circuits 901 shown in FIG. 13.

Referring to FIG. 14, data input/output buffer 13 includes a data input buffer 131, data buffers 132 and 133, and data output buffers 134. Data input buffer 131 is a circuit which receives data signals DQ0 to DQ255 inputted from data/address terminal group 21. Data buffer 132 buffers data signals DQ0 to DQ255 outputted from data input buffer 131, and then outputs buffered data signals DQ0 to DQ255 to write circuit 14. Data buffer 133 buffers data signals DQ0 to DQ255 outputted from read circuit 15 and then outputs buffered data signals DQ0 to DQ255 to data output buffer 134. Data output buffer 134 outputs data signals DQ0 to DQ255 outputted from data buffer 133 to the outside of memory 200.

Redundancy circuit 12 includes a redundancy processing circuit 121 and a spare section address determination circuit 122.

Figure 15:
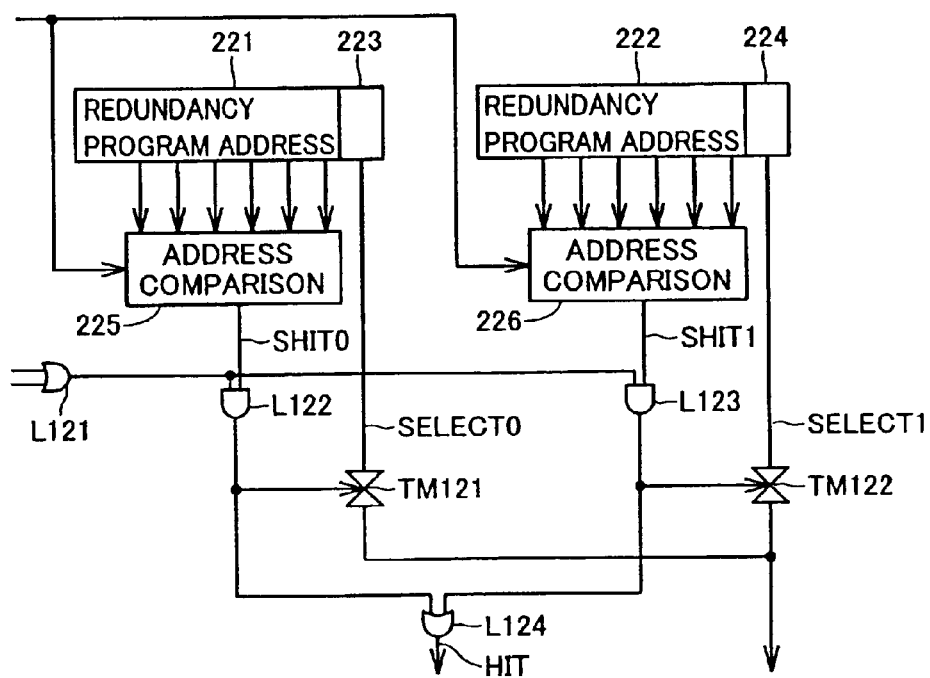
FIG. 15 is a circuit diagram showing the detail of a redundancy processing circuit.

FIG. 15 is a circuit diagram showing the detail of redundancy processing circuit 121.

Referring to FIG. 15, redundancy processing circuit 121 includes redundancy program address sections 221 and 222, recognition bit sections 223 and 224, address comparison circuits 225 and 226, transmission gates TM121 and TM122 and logical gates L121 to L24.

Redundancy program addresses 221 and 222 store defective address signals AF0 and AF1 which designate normal nonvolatile memory cells which become defective (which will be referred to as "defective memory cells" hereinafter) among normal nonvolatile memory cells, respectively. Recognition bit sections 223 and 224 are circuits which designate data latch circuits to be described later, respectively. Recognition bit section 223 outputs a designation signal SELECT0. Designation signal SELECT0 is a signal which designates a data latch circuit 30 in a write operation and which designates a data latch circuit 32 in a read operation. In addition, recognition bit section 224 outputs a designation signal SELECT1. Designation signal SELECT1 is a signal which designates a data latch circuit 31 in the write operation and which designates a data latch circuit 33 in the read operation.

Address comparison circuits 225 and 226 compare an address signal An outputted from an address counter with defective address signals AF0 and AF1, respectively. If address signal An is consistent with defective address signal AF0, address comparison circuit 225 activates a sub-hit signal SHIT0 to H level. Likewise, if address signal An is consistent with defective address signal AF1, address comparison circuit 226 activates a sub-hit signal SHIT1 to H level.

Logical gate L121 receives a pre-write control signal WRITEP and read control signal READ, and outputs an OR logical operation result. Here, pre-write control signal WRITEP is a signal which is activated when data signals DQ0 to DQ255 applied from the outside are inputted into latch circuits LT0 to LT255 in data register 19, respectively. Logical gate L122 receives sub-hit signal SHIT0 and the output signal of logical gate L121, and outputs an AND logical operation result to transmission gate TM121. Further, logical gate L123 receives sub-hit signal SHIT1 and the output signal of logical gate L121, and outputs an AND logical operation result to transmission gate TM122. Transmission gate TM121 is turned on when the output signal of logical gate L122 is at H level. At this moment, designation signal SELECT0 is transmitted to data latch circuits 30 and 32. In addition, transmission gate TM122 is turned on when logical gate L123 is at H level. At this moment, designation signal SELECT1 is transmitted to data latch circuits 31 and 33. Logical gate L124 receives the output signal of logical gate 122 and the output signal of logical gate L123, and outputs an OR logical operation result as a hit signal HIT.

Spare section address determination circuit 122 instructs write circuit 14 to output data from data latch circuits 30 and 31 in response to address signals which designate spare latch circuits SLT0 and SLT1 and pre-write operation signal WRITEP among the address signals An outputted from address counter 11. Further, spare section address determination circuit 122 instructs read circuit 15 to input data into data latch circuits 32 and 33 in response to address signals which designate spare latch circuits SLT0 and SLT1 and read control signal READ.

Write circuit 14 includes data transfer circuits 141 and 142, a multiplexer 143, an inverter IV141 and a logical gate L141. Inverter IV141 receives hit signal HIT outputted from redundancy processing circuit 121, inverts hit signal HIT and outputs the inverted signal. Logical gate L141 receives data signals DQ0 to DQ255 outputted from data buffer 132 and the output signal of inverter IV141, and outputs an AND logical operation result. Outputted data signals DQn are transmitted to multiplexer 143.

When hit signal HIT is at H level, data transfer circuit 141 receives data signals DQn outputted from data buffer 132, and outputs data signals DQn to data latch circuits 30 and 31. Here, if designation signal SELECT0 is outputted from redundancy processing circuit 121, data transfer circuit 141 outputs data signals DQn to data latch circuit 30. In addition, if designation signal SELECT1 is outputted from redundancy processing circuit 121, data transfer circuit 141 outputs data signals DQ1 to data latch circuit 31.

Data transfer circuit 141 receives the signal outputted from spare section address determination circuit 122, and outputs a designated data signal DQn among data signals DQn latched by data latch circuits 30 and 31 to multiplexer 143.

Multiplexer 143 selectively transmits data signal DQn outputted from logical gate L141 or data transfer circuit 141 to data register 19. If instructed from spare section address determination circuit 122, multiplexer 143 outputs data signal DQn outputted from data transfer circuit 142 to data register 19. If not instructed from spare section address determination circuit 122, multiplexer 143 outputs data signal DQn outputted from logical gate L141 to data register 19.

Write circuit 15 includes multiplexer 151 and 153 and a data transfer circuit 152.

Multiplexer 151 selectively outputs data signals sequentially outputted from spare nonvolatile memory cells SMC0 and SMC1 and nonvolatile memory cells MC0 to MCn in memory cell array block n, to multiplexer 153 or data transfer circuit 152. If instructed from spare section address determination circuit 122, multiplexer 151 outputs read data signal DQn to data transfer circuit 152. If not instructed from spare section address determination circuit 122, multiplexer 151 outputs read data signal DQn to multiplexer 153.

If instructed from spare section address determination circuit 122, data transfer circuit 152 outputs data signal DQn outputted from multiplexer 151 to data latch circuit 32 or 33. To which data signal DQn is outputted, data latch circuit 32 or 33, is instructed by spare section address determination circuit 122.

Multiplexer 153 receives hit signal HIT, and selectively outputs data signal DQn outputted from multiplexer 151 or data signal DQn outputted from data latch circuit 32 or 33, to data input/output buffer 13.

If hit signal HIT is at H level and designation signal SELECT0 is outputted from redundancy processing circuit 121, then multiplexer 153 reads data DQn from data latch circuit 32 and outputs the read data to data input/output buffer 13. If hit signal HIT is at H level and designation signal SELECT1 is outputted from redundancy processing circuit 121, then multiplexer 153 reads data DQn from data latch circuit 33 and outputs the read data to data input/output buffer 13.

If hit signal HIT is at L level, multiplexer 153 outputs data signal DQn received from multiplexer 151 to data input/output buffer 13.

Data latch circuits 30 and 31 latch data signals DQn to be stored in spare nonvolatile memory cells SMC0 and SMC1 in the write operation. Latch circuits 30 and 31 also latch data signals DQn read from spare nonvolatile memory cells SMC0 and SMC1 in the read operation.

The operation of nonvolatile semiconductor memory device 200 having the above-mentioned configuration will be described.

As already stated above, it is assumed herein that each memory cell array block includes 256 normal bit lines NBL0 to NBL255 and spare bit lines SPB0 and SBL0, and that latch circuits LT0 to LT255 are arranged on normal bit lines NBL0 to NBL255, respectively. It is also assumed herein that the column address of spare bit line SBL0 is #0, that of spare bit line SBL1 is #1 and those of normal bit lines NBL0 to NBL255 are #2 to #257, respectively.

Figure 16:
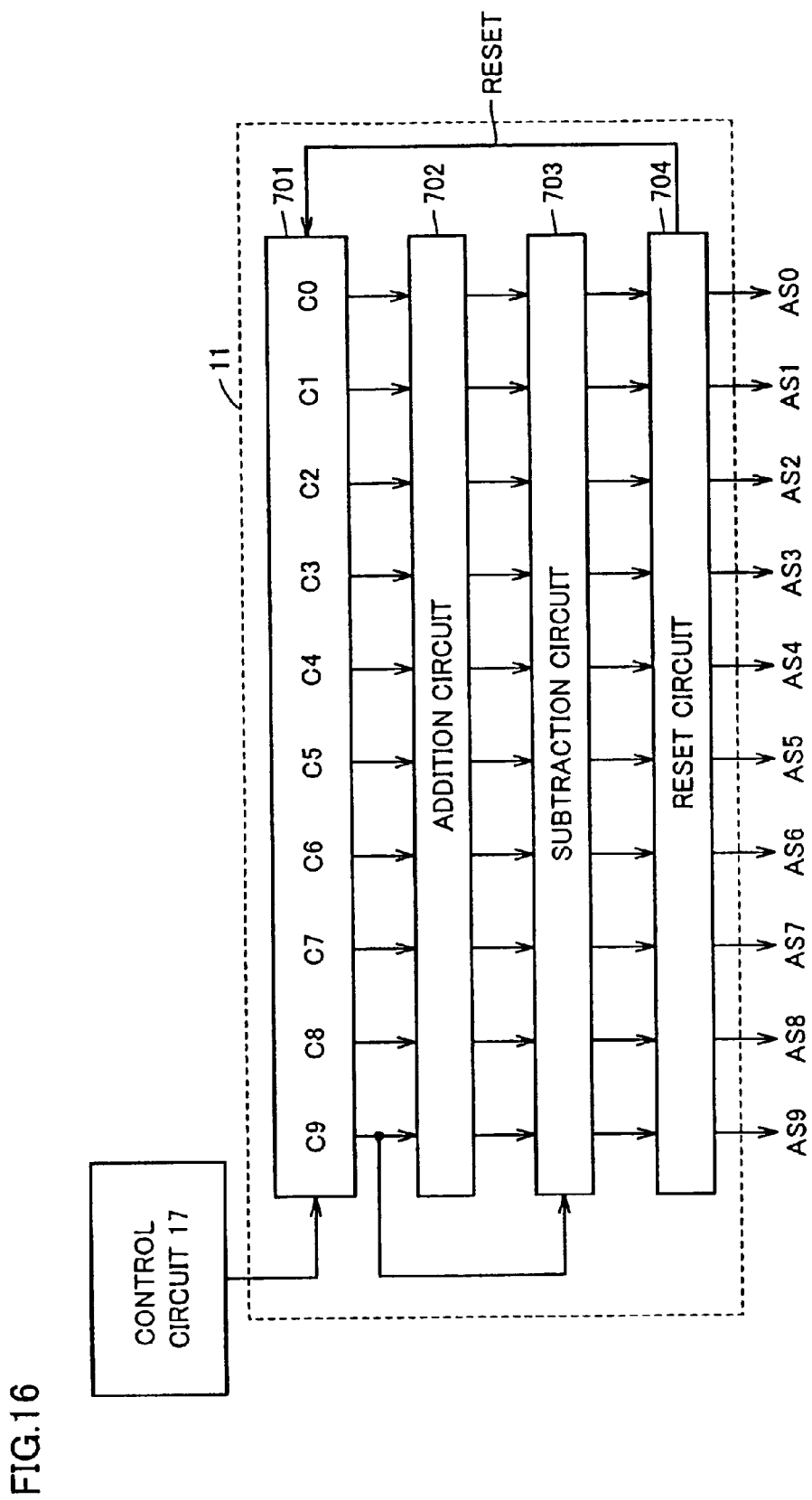
FIG. 16 is a block diagram showing the configuration of an address counter shown in FIG. 13.

FIG. 16 is a block diagram showing the configuration of address counter 11 shown in FIG. 13.

Referring to FIG. 16, address counter 11 includes a count circuit 701, an addition circuit 701, a subtraction circuit 703, and a reset circuit 704.

Count circuit 701 consists of nine flip-flops which are not shown. Count circuit 701 receives clock signal CLK outputted from control circuit 17, and outputs count signals C0 to C9 from the nine flip-flops, respectively. A state in which each of count signals C0 to C9 is active will be expressed as "1" and a state in which each of count signals C0 to C9 is inactive will be expressed as "0" hereinafter. In addition, count signals C0 to C9 outputted from count circuit 701 will be generally referred to as an "output count value" hereinafter.

Addition circuit 702 and subtraction circuit 703 are circuits which operate only in a pre-write operation. Addition circuit 702 adds a two-count value to the output count value outputted from count circuit 702 and outputs the resultant output count value. Subtraction circuit 703 subtracts 250-count value from the output count value outputted from addition circuit 702 if the output count value outputted from addition circuit 702 becomes 258 or higher.

Reset circuit 704 outputs count signals C0 to C9 outputted from subtraction circuit 703 as address count signals AS0 to AS9, respectively. An address signal An is determined by a combination of address count signals AS0 to AS9.

Further, reset circuit 704 outputs a reset signal RESET to count circuit 701 when counter circuit 701 counts 258, thereby finishing the operation of address counter 11. At this moment, count circuit 701 receives reset signal RESET and finishes the operation.

Table 1 shows the relationship between address count signals AS0 to AS9 outputted from address counter 11 and designated column addresses in the read operation.

TABLE 1

| NUMBER OF COUNTS | COUNT SIGNAL | | | | | | | | | | ADDRESS COUNT SIGNAL | | | | | | | | | | COLUMN ADDRESS |
|---|---|---|---|---|---|---|---|---|---|---|---|---|---|---|---|---|---|---|---|---|---|
| | C9 | C8 | C7 | C6 | C5 | C4 | C3 | C2 | C1 | C0 | AS9 | AS8 | AS7 | AS6 | AS5 | AS4 | AS3 | AS2 | AS1 | AS0 | |
| 1 | 0 | 0 | 0 | 0 | 0 | 0 | 0 | 0 | 0 | 0 | 0 | 0 | 0 | 0 | 0 | 0 | 0 | 0 | 0 | 0 | #0 |
| 2 | 0 | 0 | 0 | 0 | 0 | 0 | 0 | 0 | 0 | 1 | 0 | 0 | 0 | 0 | 0 | 0 | 0 | 0 | 0 | 1 | #1 |
| 3 | 0 | 0 | 0 | 0 | 0 | 0 | 0 | 0 | 1 | 0 | 0 | 0 | 0 | 0 | 0 | 0 | 0 | 0 | 1 | 0 | #2 |
| 4 | 0 | 0 | 0 | 0 | 0 | 0 | 0 | 0 | 1 | 1 | 0 | 0 | 0 | 0 | 0 | 0 | 0 | 0 | 1 | 1 | #3 |
| 5 | 0 | 0 | 0 | 0 | 0 | 0 | 0 | 1 | 0 | 0 | 0 | 0 | 0 | 0 | 0 | 0 | 0 | 1 | 0 | 0 | #4 |
| — | — | — | — | — | — | — | — | — | — | — | — | — | — | — | — | — | — | — | — | — | — |
| — | — | — | — | — | — | — | — | — | — | — | — | — | — | — | — | — | — | — | — | — | — |
| 257 | 1 | 0 | 0 | 0 | 0 | 0 | 0 | 0 | 0 | 0 | 1 | 0 | 0 | 0 | 0 | 0 | 0 | 0 | 0 | 0 | #256 |
| 258 | 1 | 0 | 0 | 0 | 0 | 0 | 0 | 0 | 0 | 1 | 1 | 0 | 0 | 0 | 0 | 0 | 0 | 0 | 0 | 1 | #257 |

Referring to Table 1, the number of counts, the states of respective count signals C0 to C9, the states of respective address count signals AS0 to AS9 and column addresses corresponding to the combinations of address count signals AS0 to AS9 according to the number of counts are shown in count sections, C0 to C9 sections, AS0 to AS9 sections, column address sections, respectively.

According to Table 1, in the read operation, bit lines BL are sequentially selected from column addresses #0 to #255 by address counter 11. That is, spare bit line SBL0 is first selected and spare bit line SBL1 is next selected. Thereafter, normal bit lines NBL0 to NBL255 are sequentially selected in this order. In the read operation, neither addition circuit 702 nor subtraction circuit 703 operate and count signals C0 to C9 and address count signals AS0 to AS9 are, therefore, equal to one another.

Next, the relationship between address count signals AS0 to AS9 outputted from address counter 11 and designated column addresses in the write operation will be described.

If the comparison result shows that address signal An is not consistent with defective addresses AF0 and AF1, then hit signal HIT outputted from logical gate L124 in redundancy circuit 121 becomes L level. Therefore, logical gate L141 in write circuit 14 sequentially outputs data signals DQ inputted in response to address signals An. Outputted data signals DQ are outputted to designated latch circuit LTn from multiplexer 143.

On the other hand, if the comparison result of address comparison circuit 225 shows that address signal An is consistent with defective address signal AF0 or AF1, hit signal HIT becomes H level. Therefore, logical gate L141 in

TABLE 2

| NUMBER OF COUNTS | COUNT SIGNAL | | | | | | | | | | ADDRESS COUNT SIGNAL | | | | | | | | | | COLUMN ADDRESS |
|---|---|---|---|---|---|---|---|---|---|---|---|---|---|---|---|---|---|---|---|---|---|
| | C9 | C8 | C7 | C6 | C5 | C4 | C3 | C2 | C1 | C0 | AS9 | AS8 | AS7 | AS6 | AS5 | AS4 | AS3 | AS2 | AS1 | AS0 | |
| 1 | 0 | 0 | 0 | 0 | 0 | 0 | 0 | 0 | 0 | 0 | 0 | 0 | 0 | 0 | 0 | 0 | 0 | 0 | 1 | 0 | #2 |
| 2 | 0 | 0 | 0 | 0 | 0 | 0 | 0 | 0 | 0 | 1 | 0 | 0 | 0 | 0 | 0 | 0 | 0 | 0 | 1 | 1 | #3 |
| 3 | 0 | 0 | 0 | 0 | 0 | 0 | 0 | 0 | 1 | 0 | 0 | 0 | 0 | 0 | 0 | 0 | 0 | 1 | 0 | 0 | #4 |
| 4 | 0 | 0 | 0 | 0 | 0 | 0 | 0 | 0 | 1 | 1 | 0 | 0 | 0 | 0 | 0 | 0 | 0 | 1 | 0 | 1 | #5 |
| 5 | 0 | 0 | 0 | 0 | 0 | 0 | 0 | 1 | 0 | 0 | 0 | 0 | 0 | 0 | 0 | 0 | 0 | 1 | 1 | 0 | #6 |
| — | — | — | — | — | — | — | — | — | — | — | — | — | — | — | — | — | — | — | — | — | — |
| — | — | — | — | — | — | — | — | — | — | — | — | — | — | — | — | — | — | — | — | — | — |
| 256 | — | — | — | — | — | — | — | — | — | — | 1 | 0 | 0 | 0 | 0 | 0 | 0 | 0 | 0 | 1 | #257 |
| 257 | 1 | 0 | 0 | 0 | 0 | 0 | 0 | 0 | 0 | 0 | 0 | 0 | 0 | 0 | 0 | 0 | 0 | 0 | 0 | 0 | #0 |
| 258 | 1 | 0 | 0 | 0 | 0 | 0 | 0 | 0 | 0 | 1 | 0 | 0 | 0 | 0 | 0 | 0 | 0 | 0 | 0 | 1 | #1 |

Referring to Table 2, at the first count, count circuit 701 outputs an output count value so that all of count signals C0 to C9 become 0. However, in the write operation, addition circuit 702 operates and adds a two-count value to the output count value. Due to this, address count signal AS1 outputted from address counter 11 becomes 1. As a result, address counter 11 designates column address #2 at the first count. In the write operation, therefore, latch circuits starting at latch circuit LT0 connected to normal bit line NBL0 are sequentially selected.

Next, when counter 11 counts 256 and the selection of all normal bit lines NBL0 to NBL255 is finished, subtraction circuit 144 performs an operation at the $257^{th}$ count. Namely, at the $257^{th}$ count, addition circuit 702 adds 2 to the output count value and then subtraction circuit 114 subtract 258 from the output count value. As a result, at the $257^{th}$ count, all of address count signals AS0 to AS9 become 0. At the $257^{th}$ count in the write operation, therefore, spare latch circuit SLT0 connected to spare bit line SBL0 is selected. Likewise, at the $258^{th}$ count, spare latch circuit SLT1 is selected. After selecting spare latch circuit SLT1, address counter 11 finishes the operation in response to reset signal RESET.

The operations of peripheral circuits 901 shown in FIG. 14 will next be described.

First, the operations peripheral circuits 901 in the write operation will be described.

In the write operation, address counter 11 selects latch circuits starting at latch circuit LT0 connected to normal bit line NBL0 by the operation described above with reference to FIG. 16. At this moment, data signal DQ corresponding to the address signal outputted from address counter 11 is inputted into data input buffer 131 and data buffer 132. Address signal An outputted from address counter 11 is inputted into redundancy processing circuit 121. Address comparison circuits 225 and 226 in redundancy processing circuit 121 compare address signal An with defective address signals AF0 and AF1, respectively.

write circuit 14 becomes L level. As a result, data signals DQ outputted from data buffer 132 are not outputted from logical gate L141.

When hit signal HIT becomes H level, data transfer circuit 141 starts an operation. Data transfer circuit 141 receives data signals DQ outputted from data buffer 132 and outputs data signals DQ to data latch circuit 30. At this moment, data latch circuit 30 is designated by select signal SELECT0 outputted from recognition bit section 223 in redundancy processing circuit 121.

Likewise, if the comparison result of address comparison circuit 226 shows that address signal An is consistent with the defective address signal, data transfer circuit 141 outputs data signals DQ outputted from data buffer 132 to data latch circuit 31. At this moment, data latch circuit 31 is designated by select signal SELECT1 outputted from recognition bit section 224 in redundancy processing circuit 121.

At this moment, no data signal DQ is inputted into latch circuits LTn corresponding to the defective memory cells having defective addresses AF0 and AF1, respectively.

After finishing outputting data signals DQ to latch circuits LT0 to LT255, data is started to be inputted into spare latch circuits SLT0 and SLT1 starts. Here, spare section address determination circuit 122 receives address signal An outputted from address counter 11, designates data latch circuit 30, and instructs data transfer circuit 141 to output data. Data transfer circuit 141 reads data signal DQ from data latch circuit 30 in accordance with the instruction of spare section address determination circuit 122, transmits data signal DQ to multiplexer 143. Multiplexer 143 transmits data signal DQ to spare latch circuit SLT0. Likewise, data transfer circuit 141 reads data signal DQ of data latch circuit 31 and transmits data signal DQ to spare latch circuit SLT1.

Through the above-mentioned operation, even if a plurality of defective memory cells exist, nonvolatile semiconductor memory device can store data by replacing the defective memory cells with the spare nonvolatile memory cells, respectively. In addition, nonvolatile semiconductor memory device can input data from the latch circuit connected to the normal bit line, and then store data to be recorded on the defective memory cells in the spare latch circuit.

Furthermore, since all pieces of data are latched by the latch circuits, respectively and then all pieces of data are written to the nonvolatile memory cells, respectively, it is possible to sequentially write data from the latch circuits to the nonvolatile memory cells.

Next, the read operation of peripheral circuits 901 shown in FIG. 14 will be described.

In the read operation, after selecting spare bit lines SBL0 and SLLT1 by the operation described with reference to FIG. 16, address counter 11 sequentially selects normal bit lines NBL.

First, data signal DQ read from spare nonvolatile memory cell MC corresponding to spare bit line SBL0 is inputted into multiplexer 151. At this moment, spare section address determination circuit 122 instructs multiplexer 151 to output data signal DQ corresponding to spare bit line SBL0 to data transfer circuit 152. Multiplexer 151 transmits data signal DQ to data transfer circuit 152.

Data transfer circuit 152 outputs data signal DQ received from multiplexer 151 to data latch circuit 32. Spare section address determination circuit 122 instructs data transfer circuit 152 to output data signal DQ to data latch circuit 32. Likewise, data signal DQ corresponding to spare bit line SBL1 is latched by data latch circuit 33 through multiplexer 151 and data transfer circuit 152.

As can be seen, in the read operation, data signals DQ corresponding to spare bit lines SBL0 and SBL1 are latched by data latch circuits 32 and 33, respectively, and then the reading of data signals DQ corresponding to normal bit lines NBL0 to NBL255 is started. At this time, address counter 11 sequentially outputs address signals An and redundancy circuit 121 compares each address signal An with defective addresses AF0 and AF1.

If the comparison result shows that address signal An is consistent with defective address signals AF0 or AF1, hit signal HIT becomes H level. At this moment, multiplexer 153 reads data from data latch circuits 32 or 33. From which circuit data is to be read, data latch circuit 32 or 33, is determined according to whether latch circuit 32 or 33 receives select signal SELECT0 or SELECT1 from redundancy circuit 121.

Multiplexer 153 outputs the read data signal to data buffer 133. Data buffer 133 transmits data signals DQ to data output buffer 134 and data output buffer 134 outputs data signals DQ to the outside.

On the other hand, if the comparison result shows that address signal An is not consistent with defective address signals AF0 and AF1, multiplexer 153 transmits data signals DQ transmitted from multiplexer 151 to data buffer 133 as it is.

As a result, even if a plurality of defective memory cells exist, nonvolatile semiconductor memory device 200 can output data signals corresponding to address signals designated by address counter 11 in the read operation.

The plurality of memory cells included in the nonvolatile semiconductor memory device according to the first to third embodiments of the present invention may be FeRAMs (Ferroelectric Random Access Memories), OUMs (Ovonic Unified Memories) or STTMs (Scalable Two Transistor Memories).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a plurality of word lines arranged in rows;
   a plurality of bit lines arranged in columns;
   a plurality of nonvolatile memory cells arranged in the rows and the columns;
   a plurality of latch circuits arranged to be electrically connected to said plurality of bit lines, and latching a plurality of data inputted externally; and
   a bit line select circuit supplying a predetermined potential to said plurality of bit lines, respectively, and maintaining potentials on said plurality of bit lines supplied with the predetermined potential, wherein
   a plurality of nonvolatile memory cells arranged in each of said rows are connected in series, and gates thereof are connected to the word line arranged in the row, and
   said plurality of bit lines are connected with the plurality of nonvolatile memory cells arranged in two columns neighboring to each other, respectively.

2. The nonvolatile semiconductor memory device according to claim 1, wherein
   said bit line select circuit includes:
      a plurality of bit line control circuits arranged to correspond to said plurality of bit lines, and controlling a potential supplied to the corresponding bit lines in response to the data latched by corresponding latch circuits, respectively;
      a connection circuit sequentially connecting said plurality of latch circuits with said plurality of bit line control circuits in response to a clock signal; and
      a predetermined potential generation circuit generating the potential supplied to said plurality of bit lines.

3. The nonvolatile semiconductor memory device according to claim 2, wherein
   each of said plurality of bit line control circuits includes:
      a control signal output circuit receiving said data, and outputting a control signal; and
      a switching circuit connecting a corresponding bit line with said predetermined potential generation circuit when receiving said control signal.

4. The nonvolatile semiconductor memory device according to claim 3, wherein
   each of said plurality of bit line control circuits further includes an end determination circuit outputting an end determination signal after a predetermined period of time after said control signal is activated, and
   said control signal output circuit includes:
      an AND logical circuit receiving said data and the end determination signal outputted from said end determination circuit in said bit line control circuit in the front column, and outputting said control signal; and
      a control signal latch circuit latching said control signal.

5. The nonvolatile semiconductor memory device according to claim 4, wherein said end determination circuit outputs said end determination signal in response to the end determination signal outputted from said end determination circuit in said bit line control circuit in the front column when said control signal is not outputted from said control signal output circuit.

6. The nonvolatile semiconductor memory device according to claim 3, wherein
said predetermined potential generation circuit includes:
a first and second predetermined potential generation circuits generating a plurality of predetermined potentials, and
said switching circuit includes:
a switching element activation circuit receiving said control signal, and outputting a switching element activation signal;
a first transistor connected between said bit line and said first predetermined potential generation circuit, and turned on when receiving said switching element activation signal; and
a second transistor connected between said bit line and said second predetermined potential generation circuit, and turned on when receiving a signal complementary to said switching element activation signal.

7. The nonvolatile semiconductor memory device according to claim 6, wherein
said switching element activation circuit includes:
an OR gate circuit receiving said control signal and said switching element activation signal outputted from the switching element activation circuit in said bit line control circuit in the rear column.

8. The nonvolatile semiconductor memory device according to claim 6, wherein
said first predetermined potential generation circuit generates a first predetermined potential during a write operation, and generates a second predetermined potential during a read operation, and
said second predetermined potential generation circuit generates a third predetermined potential during the write and read operation.

9. The nonvolatile semiconductor memory device according to claim 6, wherein
each of said plurality of nonvolatile memory cells includes:
a first data storage section; and
a second data storage section,
said first predetermined potential generation circuit generates a first predetermined potential during the write operation to said first data storage section, generates a second predetermined potential during the read operation from said first data storage section and during the write operation to said second data storage section, and generates a third predetermined potential during the read operation from said second data storage section, and
said second predetermined potential generation circuit generates said second predetermined potential during write operation to said first data storage section and during the read operation from said second data storage section, generates said third predetermined potential during the read operation from said first data storage section, and generates said first predetermined potential during the write operation to said second data storage section.

10. The nonvolatile semiconductor memory device according to claim 1, wherein
said plurality of nonvolatile memory cells includes:
a plurality of normal nonvolatile memory cells; and
a spare nonvolatile memory cell replacing a defective normal nonvolatile memory cell among said plurality of normal nonvolatile memory cells,
said plurality of bit lines includes:
a plurality of normal bit lines; and
a spare bit line connected to said spare nonvolatile memory cell,
said latch circuits include:
a plurality of normal latch circuits arranged to correspond to said plurality of normal bit lines; and
a spare latch circuit arranged to correspond to said spare bit line, said nonvolatile semiconductor memory device further comprises:
an address counter outputting an address signal;
a redundancy processing circuit determining whether said address signal is consistent with a defective address signal indicating the defective normal nonvolatile memory cell;
a write circuit sequentially writing said plurality of data to said plurality of latch circuits in response to said address signal during the write operation; and
a data latch circuit latching the data inputted and outputted into and from said spare nonvolatile memory cell, and
said write circuit transmits said data to said data latch circuit when said address signal is consistent with said defective address signal as a result of determination by said redundancy processing circuit, and writes the data latched by said data latch circuit to said spare latch circuit when said address signal designates said spare latch circuit.

11. The nonvolatile semiconductor memory device according to claim 1, wherein
said plurality of nonvolatile memory cells include:
a plurality of normal nonvolatile memory cells; and
a spare nonvolatile memory cell replacing a defective normal nonvolatile memory cell among said plurality of normal nonvolatile memory cells,
said plurality of bit lines include:
a plurality of normal bit lines; and
a spare bit line connected to said spare nonvolatile memory cell,
said latch circuits include:
a plurality of normal latch circuits arranged to correspond to said plurality of normal bit lines; and
a spare latch circuit arranged to correspond to said spare bit line, said nonvolatile semiconductor memory device further comprises:
an address counter outputting an address signal;
a redundancy processing circuit determining whether said address signal is consistent with a defective address signal indicating the defective normal nonvolatile memory cell;
a read circuit sequentially reading the plurality of pieces of data from said plurality of nonvolatile memory cells in response to said address signal during the read operation; and
a data latch circuit latching the data inputted and outputted to said spare nonvolatile memory cell, and
said read circuit transmits the data of said spare nonvolatile memory cell to said data latch circuit when said address signal designates said spare latch circuit, and reading the data of said data latch circuit and outputting the data of said data latch circuit externally when said address signal is consistent with said defective address signal as a result of determination by said redundancy processing circuit.

12. A semiconductor memory device comprising:

a memory cell array including a plurality of word lines arranged in rows, a plurality of bit lines arranged in columns, and a plurality of memory cells arranged in the rows and the columns; and a select circuit selecting one of said plurality of memory cells, wherein in said memory cell array, a plurality of memory cells arranged in each of the rows are connected in series, gates thereof are connected to the word line arranged in the row thereof, each of said plurality of bit lines is connected to a plurality of memory cells arranged in two columns neighboring each other, and said select circuit first selects the memory cell located at an end of said memory cell array, and each of said plurality of memory cells includes a plurality of storage sections, each storage section storing data.

13. A semiconductor memory device comprising:

a plurality of normal memory cells;

a spare memory cell; and a redundancy circuit determining which of said plurality of normal memory cells and said spare memory cell stores each of a plurality of pieces of data inputted externally, controlling a write operation, reading the data stored in said spare memory cell, and then determining which of the data stored in said plurality of normal memory cells and the data stored in said spare memory cell is outputted.

14. The semiconductor memory device according to claim 13, wherein said redundancy circuit includes a storage circuit storing the data inputted and outputted into and from said spare memory cell.

15. The semiconductor memory device according to claim 14, wherein said redundancy circuit writes the data stored in said storage circuit to said spare memory cell at an end of the write operation during the write operation.

16. The semiconductor memory device according to claim 14, wherein said redundancy circuit stores the data of said spare memory cell in said storage circuit at a start of a read operation during the read operation, and outputs the data of said storage circuit in response to an address signal inputted externally.

* * * * *